United States Patent
Campanella Pineda et al.

(10) Patent No.: US 10,189,705 B1
(45) Date of Patent: Jan. 29, 2019

(54) MONOLITHIC INTEGRATION OF MEMS AND IC DEVICES

(71) Applicant: GLOBALFOUNDRIES Singapore Pte. Ltd., Singapore (SG)

(72) Inventors: Humberto Campanella Pineda, Singapore (SG); Anthony Kendall Stamper, Essex Junction, VT (US); You Qian, Singapore (SG); Sharath Poikayil Satheesh, Singapore (SG); Jeffrey C. Maling, Essex Junction, VT (US); Rakesh Kumar, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 0 days.

(21) Appl. No.: 15/793,965

(22) Filed: Oct. 25, 2017

(51) Int. Cl.
*B81C 1/00* (2006.01)
*B81B 7/00* (2006.01)

(52) U.S. Cl.
CPC .......... *B81C 1/00246* (2013.01); *B81B 7/007* (2013.01); *B81B 2203/04* (2013.01); *B81B 2207/015* (2013.01); *B81B 2207/07* (2013.01); *B81B 2207/094* (2013.01); *B81C 2203/0735* (2013.01)

(58) Field of Classification Search
CPC ........ B81C 1/00246; B81C 2203/0735; B81B 7/007; B81B 2203/04; B81B 2207/015; B81B 2207/07; B81B 2207/094
See application file for complete search history.

(56) References Cited

U.S. PATENT DOCUMENTS

| | | | |
|---|---|---|---|
| 7,248,131 B2 | 7/2007 | Fazzio et al. | |
| 8,367,451 B2* | 2/2013 | Qiu | B81C 1/00095 257/E21.495 |
| 8,421,082 B1 | 4/2013 | Yang | |
| 8,587,077 B2 | 11/2013 | Chen | |
| 9,058,455 B2 | 6/2015 | Adkisson et al. | |
| 9,105,751 B2 | 8/2015 | Harame et al. | |
| 9,546,090 B1 | 1/2017 | Xia et al. | |

(Continued)

OTHER PUBLICATIONS

C.T.C.Nguyen, MEMS Technologies and Devices for Single-Chip RF Front-Ends, 2005 IMAPS/ACerS International Conference on Ceramic Interconnect and Ceramic Microsystems Technologies (CICMT), Apr. 2006, USA.

(Continued)

*Primary Examiner* — Karen Kusumakar
(74) *Attorney, Agent, or Firm* — Horizon IP PTE Ltd.

(57) ABSTRACT

An integrated monolithic device with a micro-electromechanical system (MEMS) and an integrated circuit (IC) and a method of forming thereof is disclosed. The monolithic device includes a substrate with IC components and a MEMS formed over the IC. A back-end-of-line (BEOL) dielectric having IC interconnect pads in a pad level is formed over the substrate. A MEMS is formed over the BEOL dielectric with the IC interconnect pads. The MEMS includes a MEMS stack having an active MEMS layer and patterned top and bottom MEMS electrodes formed on the top and bottom surfaces of the active MEMS layer. IC MEMS contact vias are formed at least partially through the active MEMS layer. IC MEMS contacts are formed in the IC MEMS contact vias in the active MEMS layer and configured to couple to the IC interconnect pads.

18 Claims, 30 Drawing Sheets

(56) References Cited

U.S. PATENT DOCUMENTS

| | | |
|---|---|---|
| 9,640,531 B1 | 5/2017 | Or-Bach et al. |
| 2013/0299924 A1 | 11/2013 | Weber et al. |
| 2015/0178123 A1 | 6/2015 | Brawley |
| 2016/0191017 A1 | 6/2016 | Edrees et al. |
| 2017/0141058 A1 | 5/2017 | Lee et al. |

OTHER PUBLICATIONS

L. Elbrecht et al., Integration of Bulk Acoustic Wave Filters: Concepts and Trends, Microwave Symposium Digest, 2004 IEEE MTT-S International, 2004, pp. 395-398, IEEE.

M.A. Dubois et al., Monolithic Above-IC Resonator Technology for Integrated Architectures in Mobile and Wireless Communication, IEEE Journal of Solid-State Circuits, Jan. 2006, pp. 7-16, vol. 41-No. 1, IEEE.

* cited by examiner

MONOLITHIC INTEGRATION OF MEMS AND IC DEVICES

TECHNICAL FIELD

The present disclosure relates generally to semiconductor devices. In particular, the disclosure relates to an integrated monolithic device with a micro-electromechanical system (MEMS) and an integrated circuit (IC).

BACKGROUND

Integrated micro-electromechanical system (MEMS) devices, such as filters, and integrated circuit (IC) devices, such as complementary metal oxide semiconductor (CMOS) devices, have various applications, such as mobile communication applications. Such applications are provided as system-in-packages (SiPs). However, conventional SiPs with integrated MEMS devices and IC devices suffer from various issues. For example, conventional SiPs have large footprints due to horizontal hybridization integration of the MEMS devices and ICs. In addition, conventional SiPs are inflexible due to impedance matching requirements between the MEMS devices and IC devices.

The present disclosure is directed to integrated monolithic MEMS devices and IC devices which is flexible and facilitates smaller footprints.

SUMMARY

Embodiments generally relate to an integrated monolithic device with a micro-electromechanical system (MEMS) and an integrated circuit (IC) and a method of forming thereof. The monolithic device includes a substrate with IC components and a MEMS device formed over the IC. In one embodiment, a method for forming the MEMS device over the IC is provided. A substrate with circuit components is provided. A back-end-of-line (BEOL) dielectric having IC interconnect pads in a pad level is formed over the substrate. A MEMS is formed over the BEOL dielectric with the IC interconnect pads. The MEMS includes a MEMS stack with an active MEMS layer and patterned top and bottom MEMS electrodes formed on the top and bottom surfaces of the active MEMS layer. IC MEMS contact vias are formed at least partially through the active MEMS layer. IC MEMS contacts are formed in the IC MEMS contact vias in the active MEMS layer and configured to couple to the IC interconnect pads.

In another embodiment, a MEMS device disposed over an IC is disclosed. A substrate with circuit components is provided. A back-end-of-line (BEOL) dielectric having IC interconnect pads in a pad level is disposed over the substrate. A MEMS is disposed over a top of the BEOL dielectric with the IC interconnect pads. The MEMS includes a MEMS stack with an active MEMS layer and patterned top and bottom MEMS electrodes disposed on the top and bottom surfaces of the active MEMS layer. IC MEMS contacts are disposed in the MEMS stack. The IC MEMS contacts line IC MEMS contact vias which is disposed at least partially through the active MEMS layer, and are configured to couple to the IC interconnect pads.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

Embodiments generally relate to semiconductor devices. More particularly, embodiments relate to monolithic devices, such as a system-on-chip (SoC) which is integrated with a micro-electromechanical system (MEMS) and an integrated circuit (IC). For example, the MEMS and IC are disposed on the same substrate or wafer. In one embodiment, the IC is disposed on the substrate and the MEMS is disposed on the IC. The MEMS and IC are electrically connected to form a monolithic SoC. The IC disposed on the substrate may be application-specific IC (ASIC) while the MEMS may include a MEMS component, such as a filter. The filter, for example, may be a bulk acoustic wave (BAW) filter. Providing other types of ICs and MEMS components on the same wafer may also be useful. The monolithic integrated MEMS on IC SoC may be incorporated into or used with radio frequency (RF) applications, such as mobile phones. The monolithic integrated MEMS on IC device may also be used in other applications.

Figure 1:
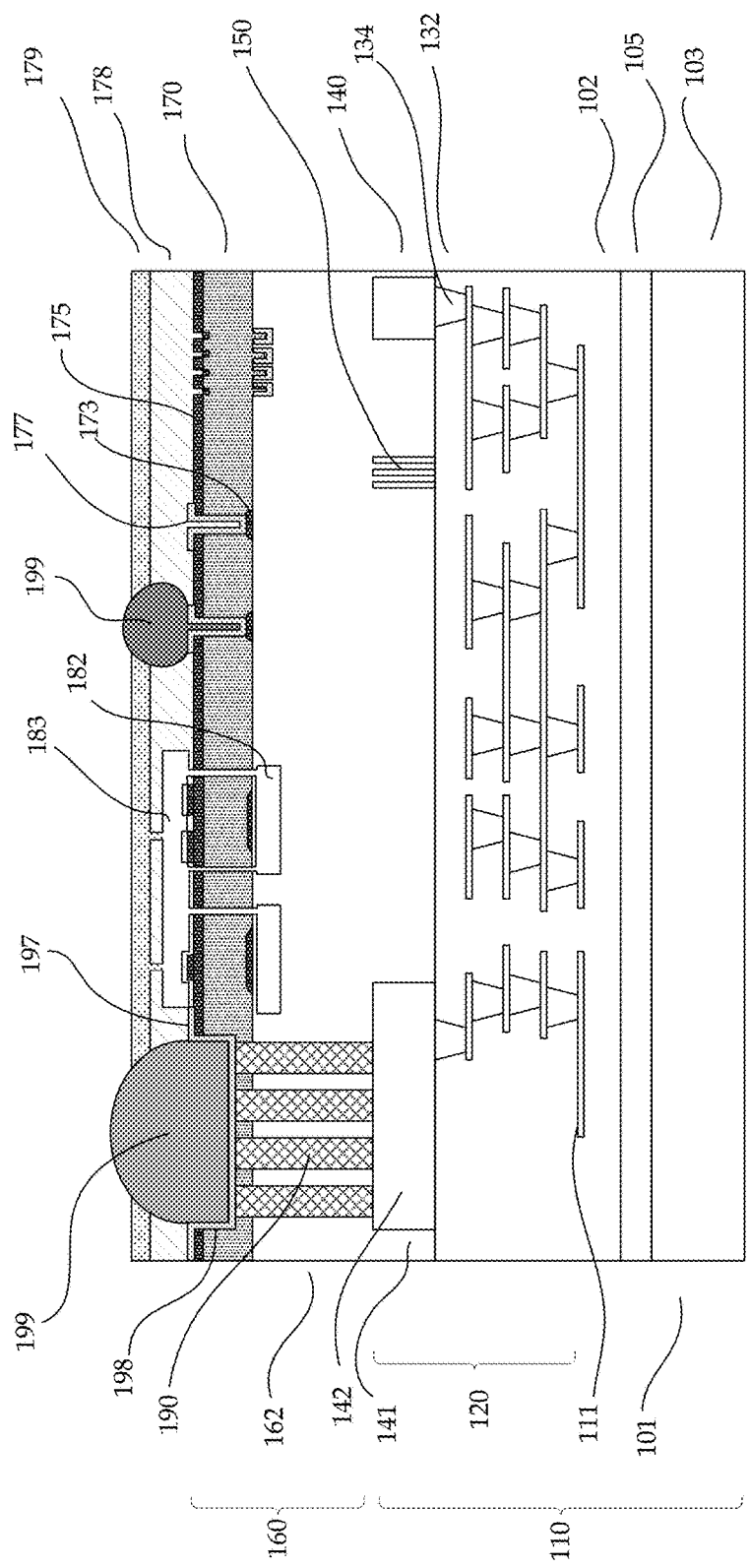
FIGS. 1-4 show simplified cross-section views of embodiments of a device.

FIG. 1 shows a simplified cross-section view of an embodiment of a portion of a monolithic device 100. The monolithic device, in one embodiment, includes a MEMS device in a MEMS region 160 and an IC 110. The MEMS device may include one or more MEMS components, such as filters and the IC may include circuit components, such as transistors. The transistors may be CMOS transistors while the filters may be BAW filters. Other types of circuit components and MEMS components may also be useful. As shown, the device includes a substrate 101. The substrate includes first and second major surfaces. The first major surface may be referred to as top surface which may serve as an active surface on which circuit components are formed while the second major surface may be referred to as a bottom surface which may be an inactive surface.

The substrate may be a crystal-on-insulator (COI) substrate. A COI substrate includes a thin surface substrate 102 and a bulk substrate 103 separated by an insulator layer 105, such as buried oxide layer (BOX). The COI substrate may be a silicon-on-insulator (SOI) substrate. In the case of a SOI, the surface and bulk are silicon substrates. Alternatively, the substrate 101 may be a bulk semiconductor substrate, such as a silicon (Si) substrate. Other types of COI or bulk substrates may also be useful. The substrate, for example, may have a thickness of about 500 um to 700 um. Other thicknesses for the substrate may also be useful.

Circuit components 111 may be disposed on the substrate. The circuit components may be front-end-of-line (FEOL) circuit components, such as CMOS transistors. It is understood that other types of FEOL circuit components may also be disposed on the substrate. For example, the CMOS transistors are disposed in transistor regions. Other types of component regions may also be provided on the substrate for other types of circuit components. Transistor and component regions may be isolated from each other by shallow trench isolation (STI) regions. A STI region, for example, surrounds a transistor region. A transistor well is disposed in the transistor region. The transistor includes a gate disposed on the first major surface of the substrate and first and second source/drain (S/D) regions on first and second sides of the gate. The gate includes a gate electrode over a gate dielectric.

A back-end-of-line (BEOL) dielectric is disposed in a BEOL region 120 on the first major surface of the substrate, covering the circuit components. The BEOL dielectric includes a plurality of interlevel dielectric (ILD) levels. An ILD level includes a contact dielectric level with via contacts and metal dielectric level with metal lines. An ILD level may be formed using various BEOL processes. For example, single damascene, dual damascene, and/or reactive ion etch techniques may be employed. Other techniques may also be employed to form ILD levels of the BEOL dielectric. The contacts may be tungsten or copper contacts while the metal lines may be copper lines. Other types of contacts and metal lines may also be useful. The contacts and metal lines of a metal level may be of the same type of conductive material or of different types of materials. The dielectric in the ILD levels, for example, may be silicon oxide. Other types of dielectric materials for the ILD levels, such as silicon nitride may also be useful. As illustrated, the BEOL dielectric may include four ILD levels. Providing a BEOL with other number of ILD levels may also be useful. The numbers of ILD levels may depend on, for example, design requirement or the logic process involved.

In one embodiment, the uppermost ILD level includes a pad via dielectric level 132. The pad via dielectric level includes via contacts 134. The BEOL region may include a pad level 140 disposed over the uppermost ILD level. The pad level includes a passivation layer 141 and contact pads 142 disposed in the passivation layer to enable external connections to the contacts in the BEOL dielectric and circuit components in the substrate. For example, the contact pads contact one or more of the via contacts in the uppermost ILD level of the BEOL dielectric. The contact pads may be referred to as the IC interconnect pads or uppermost contacts in the BEOL region. The via contacts and contact pads in the BEOL region, for example, may be Al. Other types of conductive via contacts and contact pads may also be useful. The passivation layer may be a dielectric layer such as silicon oxide. Other types of dielectric layer may also be useful. In some embodiments, alignment structures 150 may be disposed in the pad level. For example, the alignment structures may be formed in the step as the contact pads. Providing alignment structures in other dielectric levels may also be useful.

A MEMS device, in one embodiment, is disposed in the MEMS region 160. As shown, the MEMS region is disposed on top of the BEOL dielectric in the BEOL region. For example, the MEMS device is disposed on the top of the BEOL region. In one embodiment, the MEMS device includes a MEMS interposer and a MEMS stack. The interposer is disposed between the MEMS stack and the BEOL dielectric. The MEMS interposer includes a MEMS interposer dielectric layer 162 which is disposed on top of the pad level in the BEOL region. For example, the MEMS interposer dielectric layer is disposed over the passivation layer and contact pads in the BEOL region. The MEMS interposer dielectric layer covers the passivation layer and contact pads. In one embodiment, the MEMS interposer dielectric layer is a silicon oxide layer. Other types of dielectric materials for the MEMS interposer dielectric layer may also be useful. For example, the MEMS interposer dielectric layer may be formed of other oxides or nitrides in a low temperature process. In some cases, the MEMS interposer dielectric layer may be formed of a stack of dielectric layers. The stack of dielectric layers may be formed of the same dielectric material or different dielectric materials.

The MEMS stack includes top and bottom MEMS surfaces. In one embodiment, the MEMS stack includes an active MEMS layer 170 and upper and lower patterned electrodes 175 and 173 disposed on top and bottom surfaces of the active MEMS layer. For example, the MEMS stack may include a single active MEMS layer. In some embodiments, the MEMS stack may include a multiple active MEMS layered-stack. In one embodiment, the active MEMS layer may be a piezoelectric layer. The patterned lower electrode, for example, may be a patterned bottom electrode which is disposed on the MEMS interposer and the patterned upper electrode may be a patterned top electrode which is disposed on the active MEMS layer. The active MEMS layer may be disposed over the patterned bottom electrode. The active MEMS layer surrounds and covers the patterned bottom electrode on the MEMS interposer dielectric layer.

The active MEMS layer, for example, may be an aluminum nitride (AlN) layer. Providing other material for the active MEMS layer may also be useful. As for the top and bottom electrodes, they may be formed of a conductive material such as a Mo. Other types of conductive material suitable for forming the electrodes of a MEMS component may also be useful. The top and bottom MEMS electrodes may be interconnected by one or more MEMS contacts 177 disposed in a MEMS contact via in the active MEMS layer. The MEMS contact via, for example, extends through the active MEMS layer from its top surface to expose the patterned bottom electrode in the MEMS stack. The MEMS contacts connect the top and bottom electrodes. The MEMS contacts, for example, may be formed of Al. Providing other types of conductive material for the MEMS contacts may also be useful. The patterned top electrode may include contact pads. The contact pads, for example, may be formed of plated lead-free SnAg. Providing other conductive material for the contact pads may also be useful.

An encapsulation may be disposed over the MEMS stack. In some cases, the encapsulation may be a stack of encapsulation layers. The encapsulation, in one embodiment, includes first and second encapsulation layers 178 and 179. The first encapsulation layer may be one or more dielectric layers such as oxides or nitrides. As for the second encapsulation layer, it may be a sealing for the encapsulation. The second encapsulation layer, for example, may be formed of one or more dielectric layers of oxides, nitrides or a combination thereof. For example, a nitride layer may be the uppermost layer of the second encapsulation to seal against moisture.

In one embodiment, the MEMS device includes one or more MEMS components. The MEMS components, for example, include MEMS cavities. In one embodiment, the MEMS cavities include lower and upper MEMS cavities 182 and 183. In one embodiment, the lower MEMS cavities are disposed below the MEMS stack while the upper MEMS cavities are disposed on top of the MEMS stack. As shown, the lower MEMS cavities are disposed in the MEMS interposer dielectric layer. As for the upper MEMS cavities, it is disposed in the encapsulation. The lower and upper MEMS cavities may be interconnected by one or more slots. Providing other configurations for the MEMS cavities may also be useful.

In one embodiment, one or more array contacts 190 is disposed in the MEMS interposer. An array contact may be an array of via contacts. An array of via contacts is disposed on an IC interconnect pad to couple the IC interconnect pad to an IC MEMS contact 197 in the MEMS stack. The array contact may serve as a MEMS interposer contact. As shown, the array of via contacts contact the IC interconnect pad in the BEOL region. In one embodiment, the array of via contacts extends through the MEMS interposer and into the MEMS stack. For example, the via contacts of the array protrudes above a top surface of the MEMS interposer dielectric layer. The MEMS interposer contact enables coupling of IC MEMS contact in the MEMS stack to the IC interconnect pad.

The via contacts in the array, for example, may be via plugs. Each via contact of the array, for example, may have a height of about 3 um through the thickness of the MEMS interposer dielectric layer and width of about 1 um to about 5 um. The via contacts of the array may protrude above the lower MEMS cavities by about 100 nm to about less than 1 um. Providing other dimensions for the via contacts of the array in the MEMS interposer may also be useful. The via contacts may be formed of tungsten. Providing other types of conductive material for the via contacts, such as Mo, Ge, SiGe, Poly Si, may also be useful.

In one embodiment, an IC MEMS contact 197 is disposed in the MEMS stack to provide electrical connections from the MEMS stack to the IC. An IC MEMS contact, in one embodiment, lines an IC MEMS contact via 198 in the MEMS stack. In one embodiment, the IC MEMS contact via is disposed in an upper or top portion of the MEMS stack. For example, the IC MEMS contact via is disposed in an upper portion of the active MEMS layer. The IC MEMS contact via exposes a top surface of the array of via contacts. For example, the IC MEMS contact via has a width which is wider than the combined width of the via contacts in the array. The IC MEMS contact via, for example, may have a width of about 50-100 um. Other dimensions for the IC MEMS contact via may also be useful.

The IC MEMS contact 197 lines the sidewall and bottom of the IC MEMS contact via and covers a top surface of the array of via contacts. The IC MEMS contact which is disposed over the array of via contacts is coupled to the IC interconnect pad by the array of via contacts. The IC MEMS contact may have a thickness, for example, of about 0.5 um to 2 um. Other thicknesses may also be useful. The IC MEMS contact, in one embodiment, is formed in the same deposition step as the MEMS contacts 177 which is disposed in the MEMS contact vias extending through the MEMS active layer. The IC MEMS contact, for example, is formed of the same material as the MEMS contact 177. For example, the IC MEMS contact may be formed of Al. The IC MEMS contacts, for example, are formed of thick Al with a thickness of more than 1 um. Providing other conductive material and thickness for the IC MEMS contact in the MEMS stack may also be useful.

As shown, the IC MEMS contact contacts the top electrode of the MEMS stack. Accordingly, the IC MEMS contact in the MEMS stack couples the electrodes of the MEMS device to the IC interconnect pad via the array contact. Some IC MEMS contacts may not be coupled to the top electrode of the MEMS stack. For example, the device may include IC MEMS contacts which interconnect the top electrode to the IC interconnect pads and IC MEMS contacts which do not. Other configurations of IC MEMS contacts may also be useful. In some embodiments, the device 100 may include contact bumps 199 such as solder bumps which provide external connections to the device. The contact bumps, for example, may be disposed over one or more of the IC MEMS contacts and one or more of the MEMS contacts. The encapsulation layer, for example, surrounds the contact bumps.

Although only one IC MEMS contact and array contact in the MEMS region is shown, it is understood that the device may include a plurality of IC MEMS contacts and array contacts extending through the MEMS stack and MEMS interposer to couple the IC interconnects pads in the pad level to the MEMS device.

As described, the IC MEMS contact and the array contact (or interposer contact) provides electrical connections to the circuit components in a monolithic device where the MEMS device is vertically disposed on the IC. For example, a plurality of MEMS components may be formed on top of the circuit components. This advantageously reduces footprint on a chip and facilitates compactness of devices having MEMS components formed with IC. Providing the MEMS components on top of the IC also reduces parasitics as separate bumped chips are replaced with a single bumped chip. For example, the IC MEMS contact and the array contact which are formed through the MEMS stack and MEMS interposer directly provides external connections from a top surface of the MEMS device to the IC. Furthermore, insertion losses are reduced since matching networks are not required in the case where the MEMS components are disposed vertically on the IC. Insertion losses are also reduced due to shorter interconnect lines.

Figure 2:
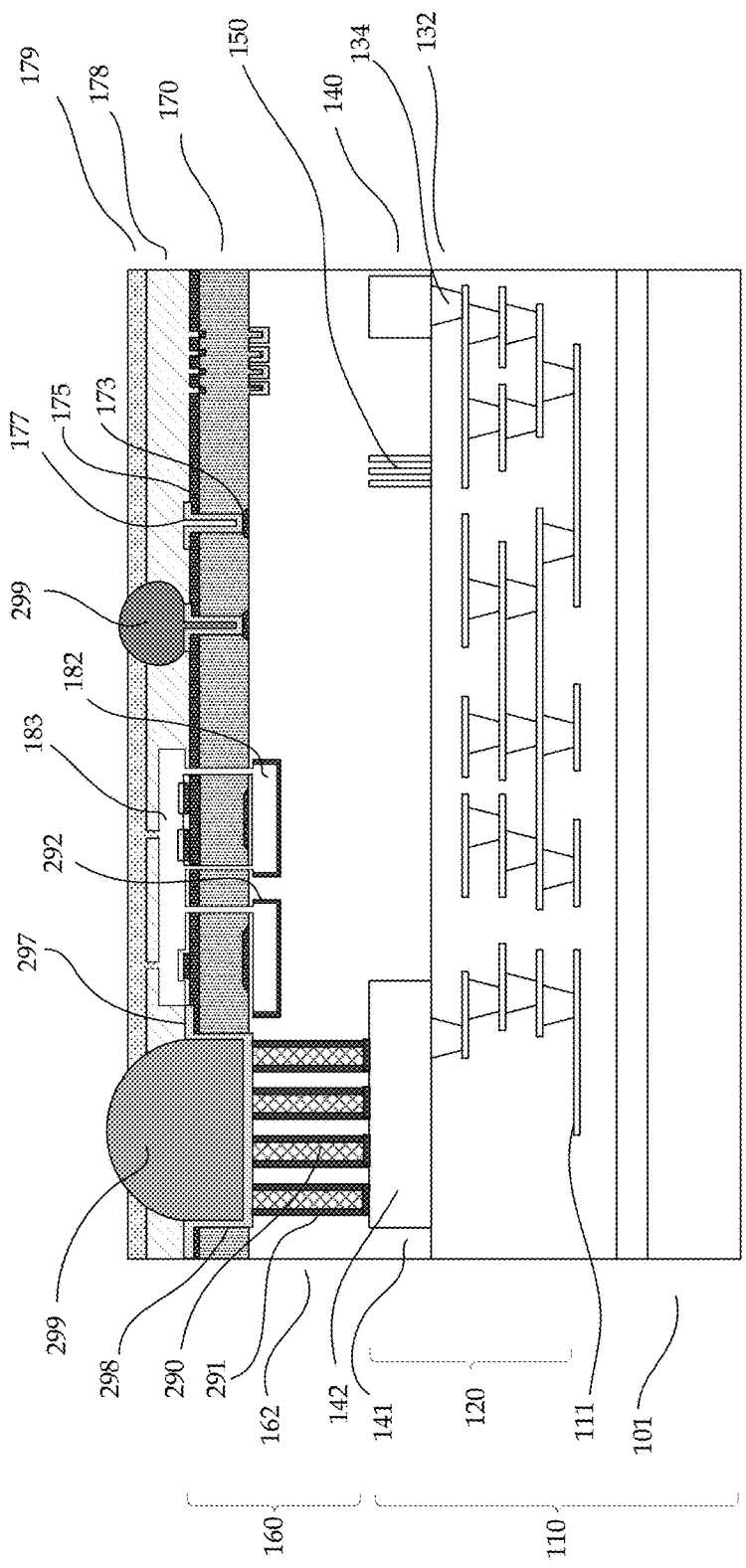

FIG. 2 shows a simplified cross-section view of another embodiment of a portion of a monolithic device 200. The monolithic device, in one embodiment, includes a MEMS device in a MEMS region 160 and an IC 110. The MEMS device may include one or more MEMS components, such as filters and the IC may include circuit components, such as transistors. The device, for example, is similar to that described in FIG. 1. Common elements may not be described or described in detail. As shown, the device includes a substrate 101. The substrate includes first and second major surfaces. The first major surface may be referred to as top surface which may serve as an active surface on which circuit components 111 are formed while the second major surface may be referred to as a bottom surface which may be an inactive surface. Similar to the device in FIG. 1, circuit components such as CMOS transistors are disposed on the first major surface of the substrate. The substrate may include other types of circuit components disposed on its first major surface. The circuit components may be formed, for example, using a FEOL process.

A BEOL dielectric is disposed in a BEOL region 120 on the first major surface of the substrate, covering the circuit components. Similarly, the BEOL dielectric includes a plurality of interlevel dielectric (ILD) levels. The uppermost ILD level includes a pad via dielectric level 132. The pad via dielectric level includes via contacts 134. Similar to the device in FIG. 1, the BEOL region may include a pad level 140 disposed over the uppermost ILD level. The pad level includes a passivation layer 141 and contact pads 142 disposed in the passivation layer to enable connections to the contacts in the BEOL dielectric and circuit components in the substrate. In some embodiments, alignment structures 150 may be disposed in the pad level.

A MEMS device, in one embodiment, is disposed in the MEMS region 160. As shown, the MEMS region is disposed on top of the BEOL dielectric in the BEOL region. The MEMS device includes a MEMS interposer and a MEMS stack. The interposer is disposed between the MEMS stack and the BEOL dielectric. The MEMS interposer includes a MEMS interposer dielectric layer 162 which is disposed on top of the pad level in the BEOL region. For example, the MEMS interposer dielectric layer is disposed over the passivation layer and contact pads in the BEOL region. The MEMS interposer dielectric layer may be a silicon oxide layer. Other types of dielectric materials for the MEMS interposer dielectric layer may also be useful. For example, the MEMS interposer dielectric layer may be formed of other oxides or nitrides in a low temperature process. In some cases, the MEMS interposer dielectric layer may be formed of a stack of dielectric layers. The stack of dielectric layers may be formed of the same dielectric material or different dielectric materials.

The MEMS stack includes top and bottom MEMS surfaces. In one embodiment, the MEMS stack includes an active MEMS layer 170 and upper and lower patterned electrodes 175 and 173 disposed on top and bottom surfaces of the active MEMS layer. For example, the MEMS stack may include a single active MEMS layer. In some embodiments, the MEMS stack may include a multiple active MEMS layered-stack. In one embodiment, the active MEMS layer may be a piezoelectric layer. The patterned lower electrode, for example, may be a patterned bottom electrode which is disposed on the MEMS interposer and the patterned upper electrode may be a patterned top electrode which is disposed on the active MEMS layer. The active MEMS layer may be disposed over the patterned bottom electrode. The active MEMS layer surrounds and covers the patterned bottom electrode on the MEMS interposer dielectric layer. The active MEMS layer, for example, may be an aluminum nitride (AlN) layer. Providing other material for the active MEMS layer may also be useful. As for the top and bottom electrodes, they may be formed of a conductive material such as a Mo. Other types of conductive material suitable for forming the electrodes of a MEMS component may also be useful.

The top and bottom MEMS electrodes may be interconnected by one or more MEMS MEMS contacts 177 disposed in a MEMS contact via in the active MEMS layer. The MEMS contact via, for example, extends through the active MEMS layer from its top surface to expose the patterned bottom electrode in the MEMS stack. The MEMS contacts connect the top and bottom electrodes. The MEMS contacts, for example, may be formed of Al. Providing other types of conductive material for the MEMS contacts may also be useful. The patterned top electrode may include contacts pads. The contact pads, for example, may be formed of plated lead-free SnAg. Providing other conductive material for the contact pads may also be useful. An encapsulation may be disposed over the MEMS stack. In some cases, the encapsulation may be a stack of encapsulation layers. The encapsulation, in one embodiment, includes first and second encapsulation layers 178 and 179. The first encapsulation layer may be one or more dielectric layers such as oxides or nitrides. As for the second encapsulation layer, it may be a sealing for the encapsulation. The second encapsulation layer, for example, may be formed of one or more dielectric layers of oxides, nitrides or a combination thereof. For example, a nitride layer may be the uppermost layer of the second encapsulation to seal against moisture.

The MEMS device, for example, may include MEMS cavities. The MEMS cavities include interconnected lower and upper MEMS cavities 182 and 183. In one embodiment, the lower MEMS cavities are disposed below the MEMS stack while the upper MEMS cavities are disposed above the MEMS stack. As shown, the lower MEMS cavities are disposed in the MEMS interposer dielectric layer. As for the upper MEMS cavities, it is disposed in the encapsulation. Providing other configurations for the MEMS cavities may also be useful.

In one embodiment, one or more array contacts 290 are disposed in the MEMS interposer. An array contact may be an array of via contacts. An array of via contacts is disposed on an IC interconnect pad to couple the IC interconnect pad to an IC MEMS contact 297 in the MEMS stack. The array contact may serve as a MEMS interposer contact. The via contacts in the array, for example, may be via plugs or tapered vias. As shown, the array of via contacts is disposed on the IC interconnect pad of the BEOL dielectric. The via contacts of the array extend through the MEMS interposer to contact the IC MEMS contact in the MEMS stack. The IC MEMS contacts may be slightly recessed into the MEMS interposer to contact a top surface of the array contact. The array contact, for example, does not protrude beyond the MEMS interposer. The array contacts enable coupling of IC MEMS contacts in the MEMS stack to the IC interconnect pads.

In one embodiment, the array of via contacts is substantially coplanar with a top surface of the lower MEMS cavities in the MEMS interposer. For example, the via contacts in the array is formed in the same step as a sacrificial layer or islands corresponding to the lower MEMS cavities prior to a release. The via contacts of the array and the sacrificial layer of the MEMS cavities, in one embodiment, may be formed of the same material. For example, the conductive material used for forming the via contacts is also used for forming the sacrificial layer in a same deposition step. Accordingly, the via contacts of the array and the MEMS sacrificial layer are filled with the same material prior to a release process for the MEMS device. The via contacts and sacrificial layer of the MEMS cavities, for example, may be formed of tungsten. Providing other types of conductive material for the via contacts, such as Mo, Ge, SiGe, Poly Si, may also be useful.

In some embodiments, the via contacts in the array contact may be surrounded by via liners 291 which lines the sidewalls and bottom of the vias. Additionally, the lower MEMS cavities may also include via liners 292 lining the sidewalls and bottom of the cavities. The via liners may be Co and Ti liners. Providing other types of via liners may also be useful. For example, the via liners of the lower MEMS cavities are formed in the same deposition step as the via liners for the via contacts of the array. The via liners in the lower MEMS cavities may be advantageous, for example, for magnetic tuning of filter frequencies. For example, the via liners may be Co and Ti liners. Providing other types of liners may also be useful.

The height of the via contacts from a top surface of the IC interconnect contacts in the BEOL dielectric to a top surface of the MEMS interposer, for example, may be about 3 um.

As for the width of each via contact, it may be about 1 um to about 5 um. Providing other dimensions for the via contacts may also be useful.

In one embodiment, an IC MEMS contact 297 is disposed in the MEMS stack. An IC MEMS contact, in one embodiment, lines an IC MEMS contact via 298 in the MEMS stack. In one embodiment, the IC MEMS contact via extends completely through the MEMS stack. For example, the IC MEMS contact via extends completely through the MEMS stack from its top surface to its bottom surface. For example, the IC MEMS contact via extends completely through the active MEMS layer. The IC MEMS contact via exposes a top surface of the array of via contacts. In some embodiments, the IC MEMS contact via may be slightly recessed into the MEMS interposer to expose the array of via contacts. For example, the IC MEMS contact via has a width which is wider than the combined width of the via contacts in the array. The IC MEMS contact via, for example, may have a width of about 50-100 um. Other dimensions for the IC MEMS contact via may also be useful.

The IC MEMS contact 297 lines the sidewall and bottom of the IC MEMS contact via and covers a top surface of the array of via contacts. The IC MEMS contact which is disposed over the array of via contacts is coupled to the IC interconnect pads by the array of via contacts. The IC MEMS contact may be formed in the same deposition step as the MEMS contacts 177 which is disposed in the MEMS contact vias extending through the active MEMS layer. The IC MEMS contact, for example, is formed of the same material as the MEMS contacts 177. For example, the IC MEMS contact may be formed of Al. The IC MEMS contact may have a thickness, for example, of about 0.5 um to 2 um. The IC MEMS contacts, for example, are formed of thick Al with a thickness of more than 1 um. Providing other conductive material and thickness for the IC MEMS contact in the MEMS stack may also be useful.

A top surface of the IC MEMS contact may serve as a contact pad for external connection to the IC. The IC MEMS contact contacts the top electrode of the MEMS stack. Accordingly, the IC MEMS contact in the MEMS stack couples the electrodes of the MEMS device to the IC interconnect pads via the array contact. In some embodiments, the device 100 may include contact bumps such as solder bumps 299 which provide external connections to the device. The contact bumps, for example, may be disposed over one or more of the IC MEMS contacts and one or more of the MEMS contacts. The encapsulation layer, for example, surrounds the contact bumps.

Figure 3:
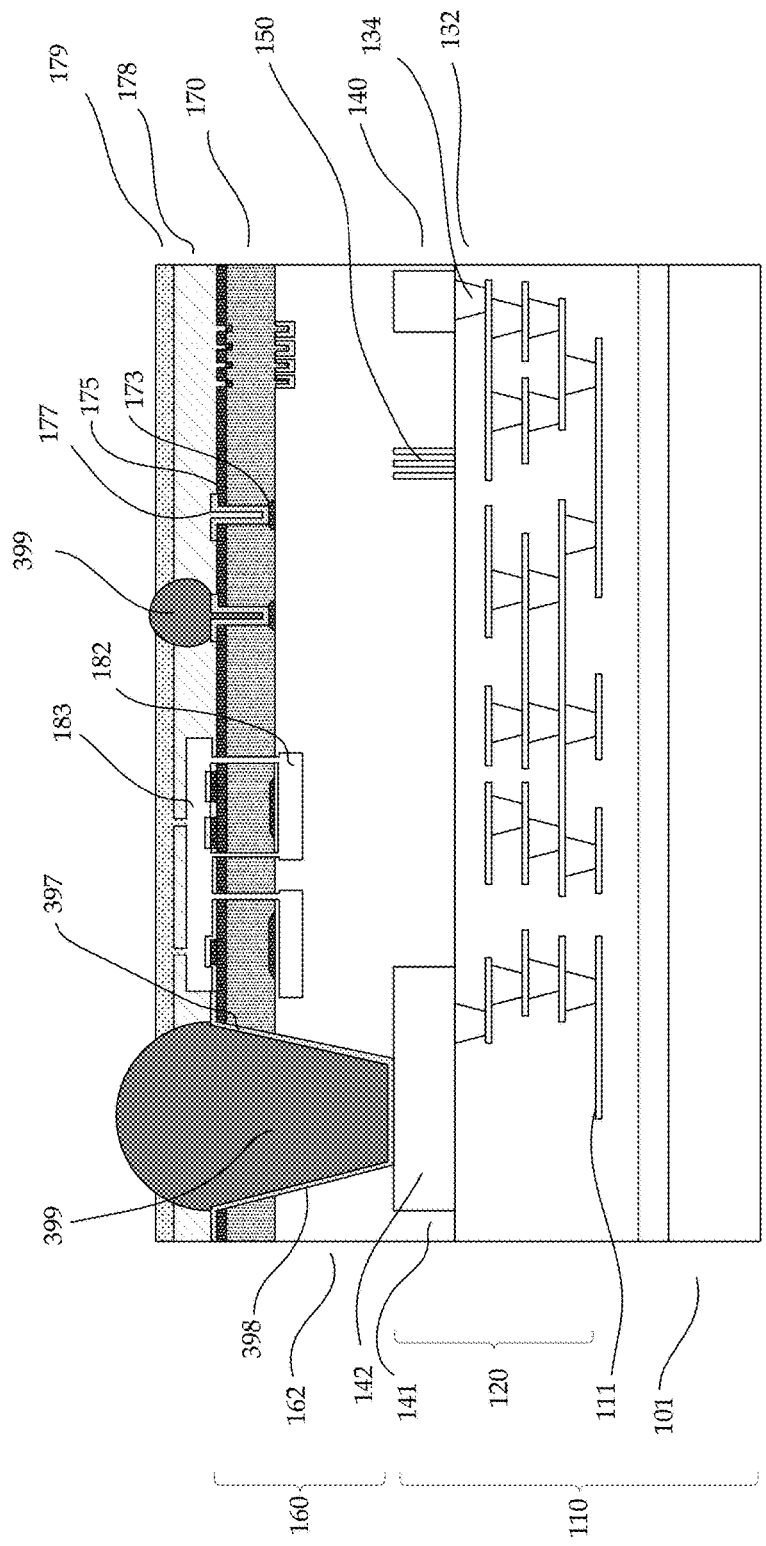

FIG. 3 shows a simplified cross-section view of another embodiment of a portion of a monolithic device 300. The monolithic device, in one embodiment, includes a MEMS device in a MEMS region 160 and an IC 110. The MEMS device may include one or more MEMS components and the IC may include circuit components. The device, for example, is similar to that described in FIGS. 1-2. Common elements may not be described or described in detail. The device includes a substrate 101 with first and second major surfaces. The first major surface may be referred to as top surface which may serve as an active surface on which circuit components 111 are formed while the second major surface may be referred to as a bottom surface similar to the devices in FIGS. 1 and 2.

A BEOL dielectric is disposed on the first major surface of the substrate in the BEOL region 120, covering the circuit components. The BEOL dielectric includes a plurality of ILD levels. The uppermost ILD level includes a pad via dielectric level 132. The pad via dielectric level includes via contacts 134. Similar to the devices in FIGS. 1-2, the BEOL region may include a pad level 140 disposed over the uppermost ILD level. The pad level includes a passivation layer 141 and contact pads 142 disposed in the passivation layer to enable connections to the contacts in the BEOL dielectric and circuit components in the substrate. In some embodiments, alignment structures 150 may be disposed in the passivation level.

A MEMS device is disposed in a MEMS region 160. As shown, the MEMS region is disposed on top of the BEOL dielectric in the BEOL region. For example, the MEMS device is disposed on the top of the BEOL region. The MEMS device includes a MEMS interposer and a MEMS stack. The MEMS interposer includes a MEMS interposer dielectric layer 162 which is disposed on top of the pad level in the BEOL region. For example, the MEMS interposer is disposed over the passivation layer and contact pads in the BEOL region. The MEMS interposer dielectric layer may be a silicon oxide layer. Other types of dielectric materials for the MEMS interposer may also be useful. For example, the MEMS interposer dielectric layer may be formed of other oxides or nitrides in a low temperature process. In some cases, the MEMS interposer may be formed of a stack of dielectric layers. The stack of dielectric layers may be formed of the same dielectric material or different dielectric materials.

The MEMS stack includes top and bottom MEMS surfaces. In one embodiment, the MEMS stack includes an active MEMS layer 170 and upper and lower patterned electrodes 175 and 173 disposed on top and bottom surfaces of the active MEMS layer. For example, the MEMS stack may include a single active MEMS layer. In some embodiments, the MEMS stack may include a multiple active MEMS layered-stack. In one embodiment, the active MEMS layer may be a piezoelectric layer. The patterned lower electrode, for example, may be a patterned bottom electrode which is disposed on the MEMS interposer and the patterned upper electrode may be a patterned top electrode which is disposed on the active MEMS layer. The active MEMS layer may be disposed over the patterned bottom electrode. The active MEMS layer surrounds and covers the patterned bottom electrode on the MEMS interposer dielectric layer.

The top and bottom MEMS electrodes may be interconnected by one or more MEMS contacts 177 disposed in MEMS contact vias in the active MEMS layer. The MEMS contact vias, for example, extends through the active MEMS layer from its top surface to expose the patterned bottom electrode in the MEMS stack. The MEMS contacts connect the top and bottom electrodes. The MEMS via contacts, for example, may be formed of Al. Providing other types of conductive material for the MEMS via contacts may also be useful.

An encapsulation may be disposed over the MEMS stack. In some cases, the encapsulation may be a stack of encapsulation layers. The encapsulation, in one embodiment, includes first and second encapsulation layers 178 and 179. The first encapsulation layer may be one or more dielectric layers such as oxides or nitrides. As for the second encapsulation layer, it may be a sealing for the encapsulation.

The MEMS device, for example, may include MEMS cavities. In one embodiment, the MEMS cavities include interconnected lower and upper MEMS cavities 182 and 183. In one embodiment, the lower MEMS cavities are disposed below the MEMS stack while the upper MEMS cavities are disposed above the MEMS stack. As shown, the lower MEMS cavities are disposed in the MEMS interposer.

As for the upper MEMS cavities, it is disposed in the encapsulation Providing other configurations for the MEMS cavities may also be useful.

In one embodiment, an IC MEMS contact 397 is disposed in the MEMS stack and MEMS interposer to provide electrical connections to the IC. The IC MEMS contact 397, in one embodiment, is disposed in an IC MEMS contact via 398 which extends through the MEMS stack and MEMS interposer. The IC MEMS contact via exposes the IC interconnect pads in the BEOL region. For example, IC MEMS contact via extends completely through the depth of the MEMS interposer dielectric layer and MEMS active layer. The IC MEMS contact via may have a slanted sidewall profile. The IC MEMS contact via, for example, may have a top width of about 50-100 um with an angle profile or slope of about 75 degrees and a height of about 3 um to 5 um. Other dimensions and configurations for the IC MEMS contact via may also be useful. For example, the IC MEMS contact via may have a vertical sidewall profile.

The IC MEMS contact lines the sidewall and bottom of the IC MEMS contact via. The IC MEMS contact may have a thickness, for example, of about 0.5 um to 2 um. Other thicknesses may also be useful. The IC MEMS contact via may be formed of Al. Providing other conductive material for the IC MEMS contact via may also be useful. The IC MEMS contact may be formed simultaneously with the MEMS contacts 177 which is disposed in the MEMS contact vias extending through the active MEMS layer. For example, the IC MEMS contact is formed in the same deposition step as the MEMS contacts which connect the top and bottom electrodes of the MEMS stack.

The IC MEMS contact contacts the top electrode of the MEMS device. Accordingly, the IC MEMS contact connects the MEMS device to the IC interconnect pad in the pad level. In some embodiments, the device 300 may include contact bumps 399 such as solder bumps which provide external connections to the device. The contact bumps, for example, may be disposed over one or more of the IC MEMS contacts and one or more of the MEMS contacts. The encapsulation layer, for example, surrounds the contact bumps.

Figure 4:
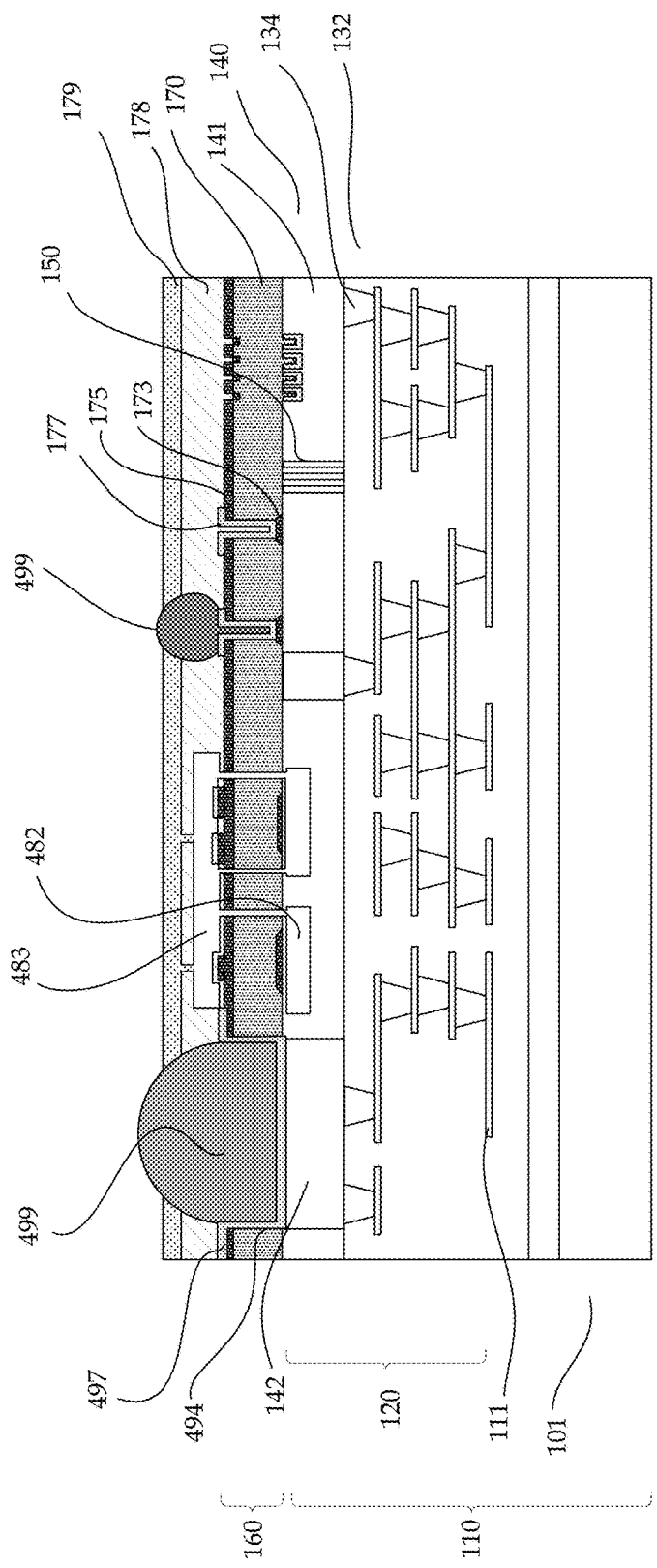

FIG. 4 shows a simplified cross-section view of yet another embodiment of a portion of a monolithic device 400. The monolithic device, in one embodiment, includes a MEMS device in a MEMS region 160 and an IC 110. The MEMS device may include one or more MEMS components and the IC may include circuit components. The device, for example, is is similar to that described in FIGS. 1-3. Common elements may not be described or described in detail. The device includes a substrate 101 with first and second major surfaces. The first major surface may be referred to as top surface which may serve as an active surface on which circuit components 111 are formed while the second major surface may be referred to as a bottom surface.

A BEOL dielectric is disposed in a BEOL region 120 on the first major surface of the substrate, covering the circuit components. The BEOL dielectric includes a plurality of ILD levels. The uppermost ILD level includes a pad via dielectric level 132. The pad via dielectric level includes via contacts 134. Similar to the devices in FIGS. 1-3, the BEOL region may include a pad level 140 disposed over the uppermost ILD level. The pad level includes a passivation layer 141 and IC interconnect pads 142 disposed in the passivation layer to enable connections to the contacts in the BEOL dielectric and circuit components in the substrate. In some embodiments, alignment structures 150 may be disposed in the passivation level.

A MEMS device is disposed in a MEMS region 160. As shown, the MEMS region is disposed on top of the BEOL dielectric in the BEOL region. For example, the MEMS device is disposed on top of the BEOL dielectric. The MEMS device, in one embodiment, includes a MEMS stack which is disposed on top of the pad level. For example, the MEMS stack is disposed on top of the passivation layer with the IC interconnect pads.

The MEMS stack includes top and bottom MEMS surfaces. In one embodiment, the MEMS stack includes an active MEMS layer 170 and upper and lower patterned electrodes 175 and 173 disposed on top and bottom surfaces of the active MEMS layer. For example, the MEMS stack may include a single active MEMS layer. In some embodiments, the MEMS stack may include a multiple active MEMS layered-stack. In one embodiment, the active MEMS layer may be a piezoelectric layer. The patterned lower electrode, for example, may be a patterned bottom electrode which is disposed on top of the passivation layer. The patterned upper electrode may be a patterned top electrode which is disposed on the active MEMS layer. The active MEMS layer may be disposed over the patterned bottom electrode. The active MEMS layer surrounds and covers the patterned bottom electrode on the passivation layer.

The top and bottom MEMS electrodes may be interconnected by one or more MEMS contacts 177 disposed in a MEMS contact via in the active MEMS layer. The MEMS contact via, for example, extends through the active MEMS layer from its top surface to expose the patterned bottom electrode in the MEMS stack. The MEMS contact via exposes the patterned bottom electrode. The MEMS contact connects the top and bottom electrodes. The MEMS via contacts, for example, may be formed of Al. Providing other types of conductive material for the MEMS via contact may also be useful. An encapsulation may be disposed over the MEMS stack. In some cases, the encapsulation may be a stack of encapsulation layers. The encapsulation may include first and second encapsulation layers 178 and 179. The first encapsulation layer may be one or more dielectric layers such as oxides or nitrides. As for the second encapsulation layer, it may be a sealing for the encapsulation.

The MEMS device, for example, may include MEMS cavities. In one embodiment, the MEMS cavities include interconnected lower and upper MEMS cavities 482 and 483. The lower MEMS cavities are disposed below the MEMS stack while the upper MEMS cavities are disposed above the MEMS stack. In one embodiment, the lower MEMS cavities are disposed in the passivation layer in the BEOL region. In one embodiment, the lower MEMS cavities are substantially coplanar with the IC interconnect pads in the passivation layer of the pad level. As for the upper MEMS cavities, it may be disposed in the encapsulation. Providing other configurations for the MEMS cavities may also be useful.

In one embodiment, an IC MEMS contact 497 is disposed in the MEMS stack to provide electrical connections to the IC. An IC MEMS contact, in one embodiment, lines an IC MEMS contact via 494 in the MEMS stack. The IC MEMS contact via extends completely through the MEMS stack. For example, the IC MEMS contact extends through the active MEMS layer from its top surface to its bottom surface. The IC MEMS contact via exposes a top surface of an IC interconnect pad. The IC MEMS contact via may have a vertical sidewall profile. The IC MEMS contact via, for example, may have width of about 50-100 um and a height of about 1 um to 3 um. The height of the IC MEMS contact via, for example, may be about 500 nm to 3 um. Other dimensions and configurations for the IC MEMS contact vias may also be useful. For example, IC MEMS contact via may have a slanted sidewall profile. The IC MEMS contacts is disposed on the surface of the IC interconnect pad in the passivation layer.

The IC MEMS contacts lines the sidewall and bottom of the IC MEMS contact via. The IC MEMS contacts may have a thickness, for example, of about 0.5 um to 2 um. Other thicknesses may also be useful. The IC MEMS contacts may be formed of Al. Providing other conductive material may also be useful. The IC MEMS contacts may be formed simultaneously with the MEMS contacts which are disposed in the MEMS contact vias extending through the MEMS active layer. For example, the IC MEMS contacts is formed in the same deposition step as the MEMS contact which connects the top and bottom electrodes of the MEMS stack.

The IC MEMS contact contacts the top electrode of the MEMS device. Accordingly, the IC MEMS contacts directly connects the electrodes of the MEMS device to the IC interconnect pad. The device 400 may include contact bumps 499 which provides external connections to the device. The contact bumps, for example, may be disposed over one or more of the IC MEMS contacts and one or more of the MEMS contacts.

FIGS. 5a-5k show simplified cross-sectional views of an embodiment of a process 500 for forming a device. The device, for example, is similar to that described in FIG. 1. Common elements may not be described or described in detail. In one embodiment, the process describes forming a monolithic device with a MEMS device formed over an IC. For example, the MEMS device may include one or more MEMS components and the IC may include circuit components.

Figure 5A:
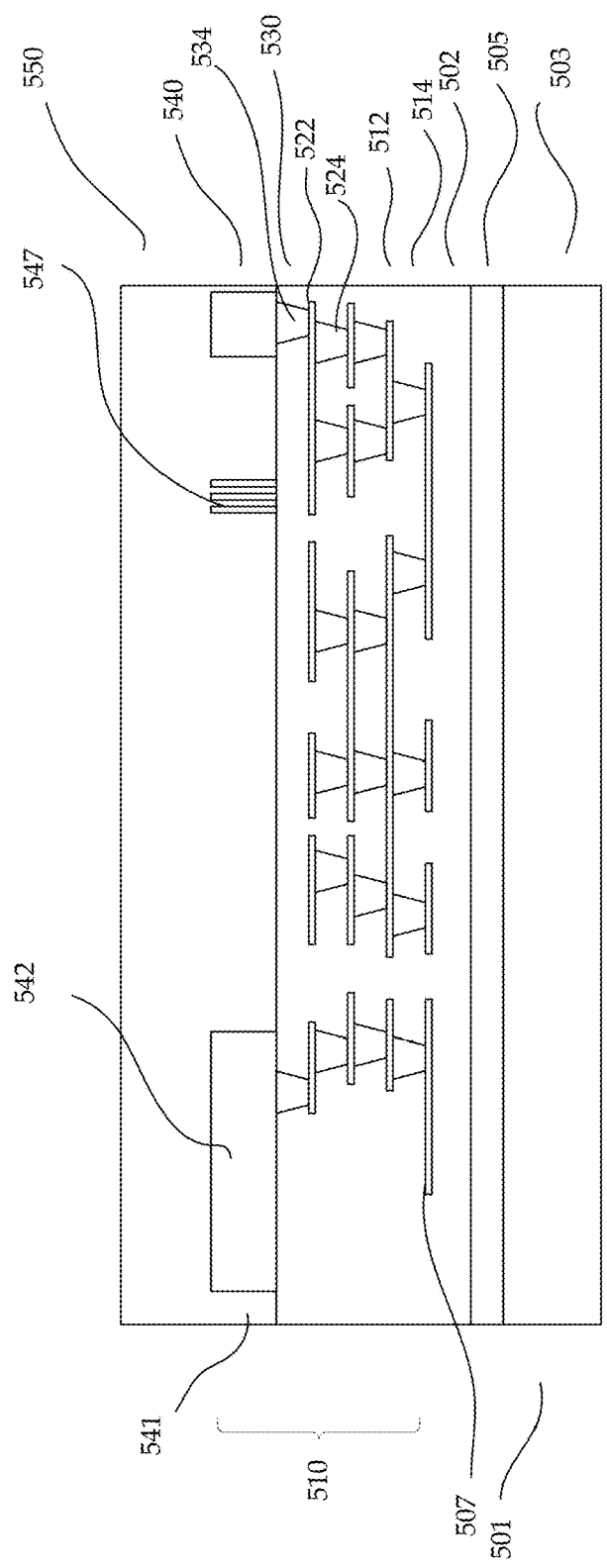
FIGS. 5a-5k show an embodiment of a process for forming a device.

Referring to FIG. 5a, a substrate 501 is provided. The substrate includes first and second major surfaces. The substrate, in one embodiment, may be a SOI substrate. A SOI substrate includes a surface substrate 502 and a bulk substrate 503 separated by an insulator layer 505, such as buried oxide layer (BOX). The surface substrate which includes the first major surface may be silicon or other types of surface substrates. For example, the surface substrate may be a silicon carbide (SiC) or a sapphire substrate. As for the bulk substrate which includes the second major surface, it may be a silicon bulk. Alternatively, the substrate 501 may be a bulk semiconductor substrate, such as a Si substrate. Other types of substrates are also useful. The substrate, for example, may have a thickness of about 500 um to 700 um.

For simplicity of discussion, only a portion of the device is illustrated. It should be understood that the substrate may be a wafer on which a plurality of devices are formed. For example, the substrate is a wafer which is processed to form a plurality of devices in parallel. After the devices are formed, the wafer is diced to singulate the devices.

The first major surface of the substrate is processed to form circuit components 507. In one embodiment, the circuit components are formed using front-end-of-line (FEOL) processing. For example, FEOL processing may be performed on the first major surface of the substrate to form FEOL components such as CMOS transistors. Other types of circuit components may also be formed by the FEOL processing.

Back-end of line (BEOL) processing is performed after the FEOL processing. The BEOL process includes forming a BEOL dielectric in a BEOL region 510. The BEOL dielectric covers the FEOL components on the first major surface of the substrate. The BEOL dielectric includes a plurality of interlevel dielectric (ILD) levels. An ILD level includes a metal dielectric level 512 over a contact dielectric level 514. The metal and contact level dielectrics may be silicon oxide. Providing other dielectric materials such as low k dielectrics may also be useful. The metal and contact level dielectrics, for example, may be formed by chemical vapor deposition (CVD). The metal and contact level dielectrics may also be formed by other techniques.

For example, the process of forming the ILD levels includes forming a first ILD level over the FEOL circuit components, such as the transistors and other circuit components. A dielectric layer of the first ILD level serves as a pre-metal dielectric layer or first contact layer of the BEOL dielectric. The dielectric layer may be referred to as CA level of the BEOL dielectric. Contacts are formed in the CA level dielectric layer. The contacts may be formed by a single damascene process. For example, via openings are formed in the dielectric layer using mask and etch techniques. For example, a patterned resist mask with openings corresponding to the vias is formed over the dielectric layer. An anisotropic etch, such as a reactive ion etch (RIE), is performed to form the vias, exposing contact regions below, such as transistor S/D regions and gates. A conductive layer, such as tungsten, is deposited to cover the CA dielectric and filling the openings. The conductive layer may be formed by sputtering. Other techniques may also be useful. A planarization process, such as chemical mechanical polishing (CMP), is performed to remove excess conductive materials, leaving contact plugs in the CA level.

After forming contacts in the CA level, the process continues to form a dielectric layer over the wafer, covering the CA level dielectric layer. The dielectric layer, for example, serves as a first metal level M1 of the first ILD level. The metal level dielectric layer, for example, is a silicon oxide layer. Other types of dielectric layers may also be useful. Conductive lines are formed in the M1 level dielectric layer. The conductive lines may be formed by a damascene technique. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. Excess conductive materials are removed by, for example, chemical mechanical polishing (CMP), leaving a planar surface with M1 dielectric. The first metal level M1 and CA may be referred as the first ILD level.

The process continues to form additional ILD levels of the BEOL dielectric. For example, the process continues to form intermediate and upper ILD levels above the first ILD level. A metal level dielectric includes conductors or metal lines 522 while the contact level dielectric includes via contacts 524. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal level ILDs, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines. In some cases, the BEOL dielectric may include dielectric etch stop liners between ILD levels or between metal level and contact level dielectrics. Other configurations of the BEOL dielectric may also be useful.

The BEOL dielectric may include, for example, about four ILD levels. Providing a BEOL with other number of ILD levels may also be useful. The numbers of ILD levels may depend on, for example, design requirement or the logic process involved. The uppermost ILD level, in one embodiment, includes a pad via dielectric level 530. The pad via dielectric level, for example, may be the uppermost dielectric level of the BEOL dielectric. The pad via dielectric level includes via contacts 534. The via contacts, for example, may be Al. Other types of conductive material for the via contacts may also be useful.

A pad level 540 may be formed over the uppermost ILD level. The pad level includes a passivation layer 541 and contact pads 542. For example, the contact pads may be formed to contact one or more of the via contacts in the uppermost ILD level of the BEOL dielectric. The contact pads may be referred to as IC interconnect pads or uppermost contacts of the IC in the BEOL region. The passivation layer may be a dielectric layer such as silicon oxide. Other types of dielectric layer may also be useful. In some embodiments, alignment structures 547 may be formed in the passivation level. The alignment structure may be marks for aligning subsequent process steps of forming the MEMS device to the features in the BEOL region such as, for example, the IC interconnect pads. The alignment mark may be formed simultaneously with the IC interconnect pads. For example, the alignment mark and IC interconnect pads may be formed by depositing and patterning a conductive layer on the uppermost ILD level of the BEOL dielectric. The alignment mark and IC interconnect pads, for example, may be Al. Other types of conductive material may also be useful.

In one embodiment, a MEMS device is formed over the IC on the wafer. The MEMS device may be formed in a MEMS region on the wafer. The MEMS region, in one embodiment, is on top of the BEOL region. In one embodiment, the MEMS device includes a MEMS interposer and a MEMS stack. The MEMS interposer is formed over the pad level with the IC interconnect pads. The MEMS interposer includes a MEMS interposer dielectric layer 550 which is deposited over the passivation layer and IC interconnect pads in the passivation layer. For example, a first thickness of the interposer dielectric layer is deposited. In one embodiment, the MEMS interposer dielectric layer is a silicon oxide layer. Providing other types of material which is formed using a low temperature process for the interposer dielectric layer may also be useful. For example, the interposer dielectric layer may be formed of other oxides or nitrides. The deposited MEMS interposer dielectric layer is planarized to provide a planar top surface. For example, a polishing process such as CMP may be employed to planarize the MEMS interposer dielectric layer. Other planarization processes may also be useful.

Figure 5B:
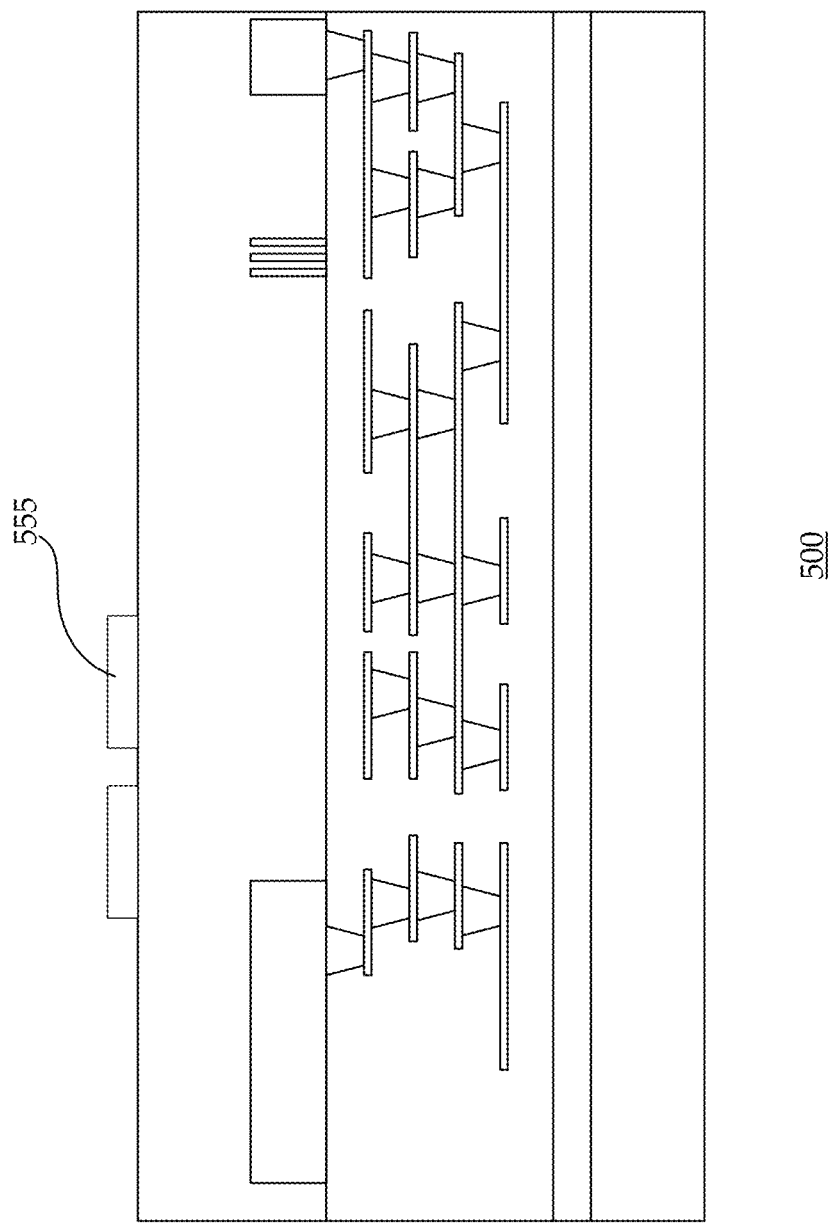

Referring to FIG. 5b, sacrificial islands 555 are formed on the MEMS interposer dielectric layer. For example, the sacrificial islands are formed on a first thickness of the MEMS interposer dielectric layer. The sacrificial islands are used for forming MEMS cavities for the MEMS components in a subsequent step. For example, the sacrificial islands serve as a sacrificial layer for forming a lower MEMS cavity of a MEMS component. The sacrificial islands are formed by depositing a sacrificial layer. The sacrificial layer, for example may have a thickness of about 100 nm to 2 um. Providing other thicknesses may also be useful. The sacrificial layer, for example, may be amorphous Si (A-Si). Other low temperature material formed in a low temperature process may also be useful. For example, the sacrificial layer may be a Poly Si, Mo, W, Ge.

The sacrificial layer is then patterned to form the sacrificial islands corresponding to one or more lower MEMS cavities. The sacrificial islands are patterned to correspond to the desired dimensions of the lower MEMS cavity. For example, each island of the sacrificial islands may have a width of about 100 um to 200 um. Providing other widths for the sacrificial islands may also be useful. The sacrificial layer is patterned, for example, by mask and etch techniques. For example, a dry etch such as a reactive ion etch (RIE) may be employed to pattern the sacrificial islands. Other techniques for patterning the sacrificial layer may also be useful. The sacrificial islands, for example, serve as a sacrificial layer for forming lower MEMS cavities of one or more filters in a release process.

Figure 5C:
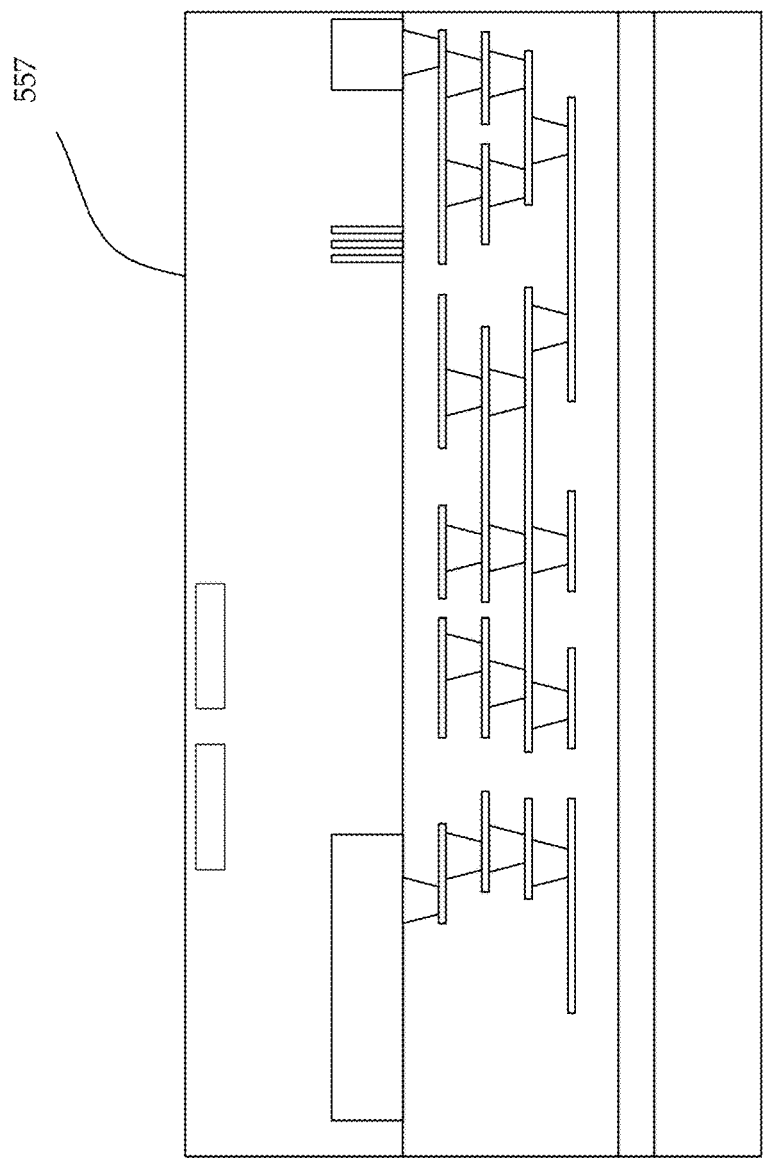

After forming the sacrificial islands, another dielectric layer of the MEMS interposer dielectric is deposited to cover the sacrificial islands. For example, a second thickness of the MEMS interposer dielectric layer is deposited to sufficiently cover the sacrificial islands. The dielectric layer may be the same material as that used for forming the first thickness of the MEMS interposer dielectric layer prior to forming the sacrificial islands. Providing different dielectric layers may also be useful. The MEMS interposer dielectric layer deposited on the passivation layer, for example, may be formed of a stack of dielectric layers. The stack of dielectric layers may be formed of the same material or different material. A planarization process such as CMP may be performed to provide a substantially planar top surface 557 of the MEMS interposer dielectric layer as shown in FIG. 5c. The MEMS interposer, for example, just covers a top surface of the sacrificial islands.

In one embodiment, an alignment mark may be formed in the MEMS interposer (not shown). For example, alignment mark trenches may be formed in the dielectric layer using mask and etch techniques. Alternatively, the formation of the sacrificial islands and alignment marks may be by depositing a first thickness of the MEMS interposer dielectric layer, followed by etching the dielectric layer to form cavities corresponding to the sacrificial islands, filling the cavities with sacrificial material, planarizing the wafer to provide a substantially planar top surface of the sacrificial islands with the interposer dielectric layer and forming alignment marks trenches in the interposer dielectric layer.

Figure 5D:
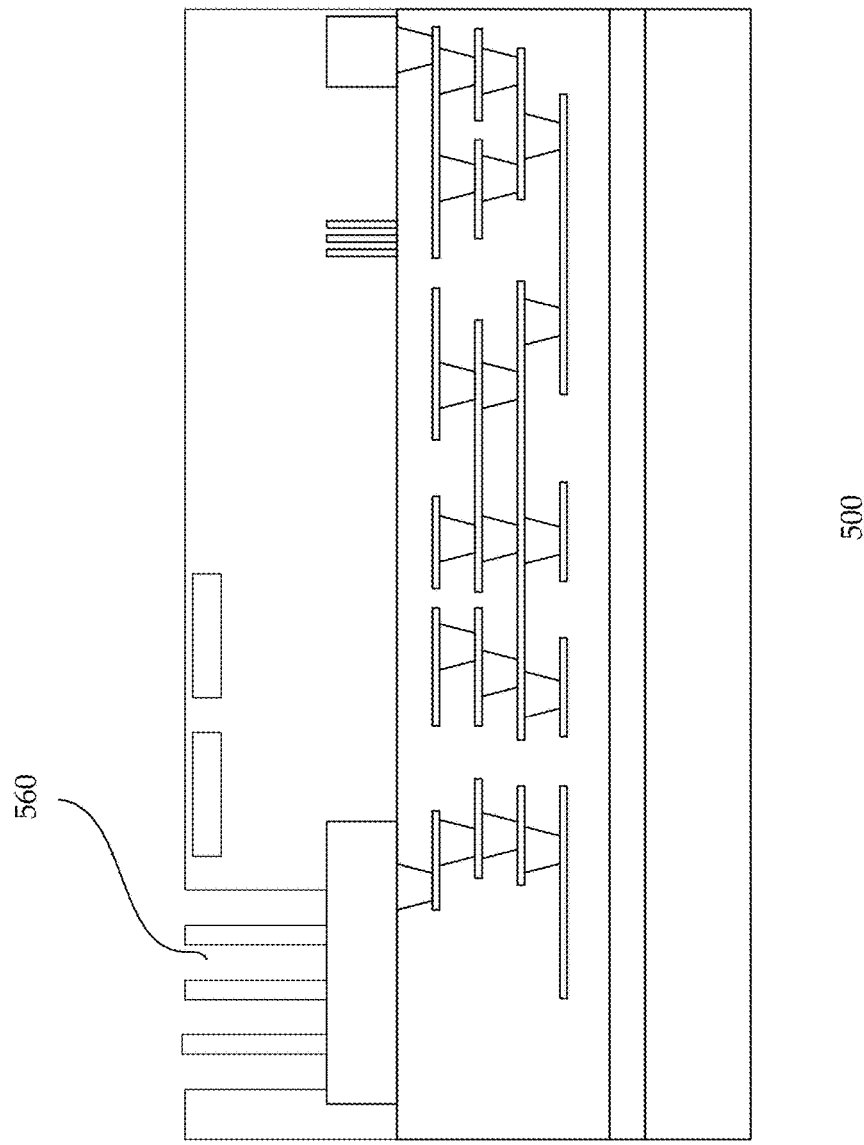

In one embodiment, an array of via openings 560 is formed through the MEMS interposer dielectric layer, as illustrated in FIG. 5d. The array of via openings corresponds to an array of via contacts (or MEMS interposer contacts) to be formed. For example, via openings with vertical sidewalls may be formed. The via openings may be formed using mask and etch techniques. For example, a dry etch such as a reactive ion etch (RIE) is performed using an etch mask to form via openings through the MEMS interposer dielectric layer. The via openings extend through the MEMS interposer dielectric layer to expose the IC interconnect pads. For example, the via openings extend through the MEMS interposer dielectric layer to expose the contacts pads in the pad level of the BEOL region. Each via opening, for example, may have a width of about 1 um and a height of about 3 um. Providing via openings with other dimensions may also be useful.

Figure 5E:
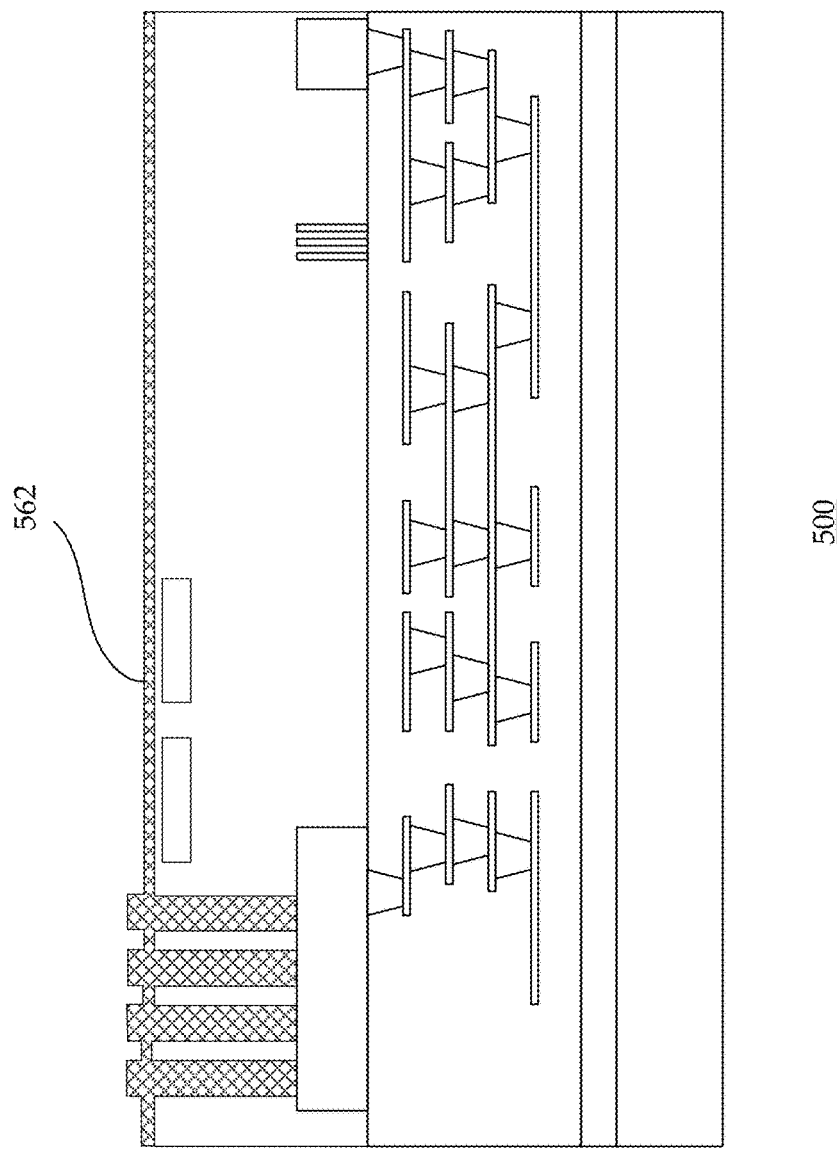

After forming the via openings, a conductive material 562, such as tungsten, is deposited over the wafer. As shown in FIG. 5e, the conductive material fills the via openings.

Other conductive materials such as Mo or Cu, may also be useful. In the case where alignment mark trenches are formed in interposer dielectric layer, the conductive material fills the trenches as formed earlier, forming the alignment marks.

Figure 5F:
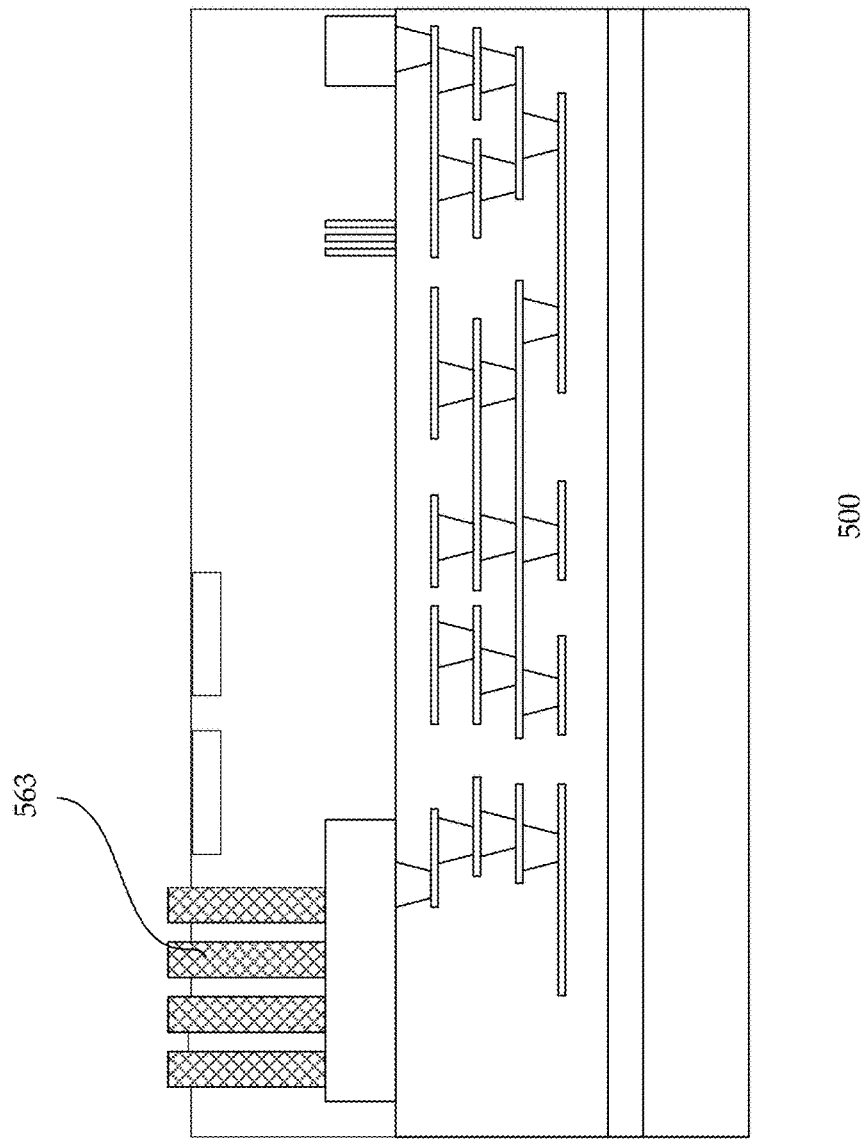

Referring to FIG. 5f, a planarization process, such as CMP, is performed to remove excess conductive layer on the MEMS interposer, forming via contacts or via studs 563. In one embodiment, the planarization process is performed until a top surface of the sacrificial islands in the MEMS interposer dielectric layer is exposed. For example, the CMP process removes excess conductive material and MEMS interposer dielectric layer to expose the top surface of the sacrificial islands. The planarization process which is performed until the top surface of the sacrificial islands are exposed results in the array of via contacts protruding above the sacrificial islands. As shown, an array of via contacts is formed in the MEMS interposer which protrude above a top surface of the MEMS interposer dielectric layer and sacrificial islands. Performing a planarization process which leaves the via contacts of array protruding above the top surface of the interposer dielectric layer obviates removing sacrificial material in the sacrificial islands.

The array of via contacts in the MEMS interposer contacts the IC interconnect pad in the pad level of the BEOL region and couples to the circuit components such as the CMOS transistors in the substrate. After forming the array of via contacts on the IC interconnect pad, a dielectric layer may be deposited over the wafer. The dielectric layer covers the sacrificial islands and a top surface of the array of via contacts. For example, the dielectric layer may have the same material or a different material as the MEMS interposer on which it is deposited, forming another layer of the MEMS interposer.

The process continues with forming the MEMS stack. In one embodiment, patterned top and bottom electrodes and an active MEMS layer 570 are formed on the MEMS interposer. For example, an electrode layer is formed over the MEMS interposer dielectric layer and patterned to form the bottom electrode 573. The bottom electrode may be formed by depositing an electrode layer such as a Mo layer. Other types of conductive material suitable for forming the electrode of a MEMS device may also be useful. The bottom electrode layer is patterned to form the bottom electrode, for example, using an etch such as RIE.

Figure 5G:
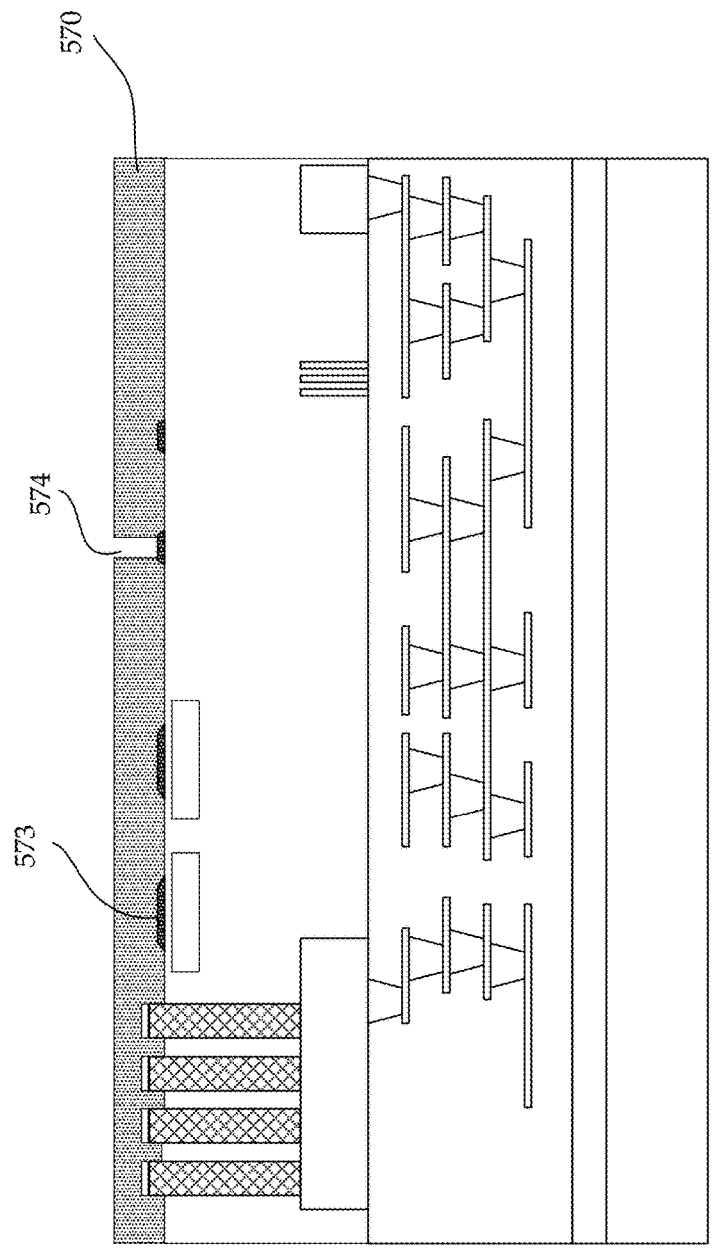

The active MEMS layer may be a single active MEMS layer or a multiple active MEMS layered-stack. The active MEMS layer 570 is deposited over the MEMS interposer, covering and surrounding the protruded portion of the array of via contacts and the patterned bottom electrode, as shown in FIG. 5g. The active MEMS layer may be a piezoelectric layer. For example, the active MEMS layer may be an aluminum nitride (AlN) layer. Providing other material for the active MEMS layer may also be useful. In some embodiments, one or more MEMS contact vias 574 may be formed in the active MEMS layer. A MEMS contact vias extends through the active MEMS layer from a top surface of the active MEMS layer to expose a patterned bottom electrode. The MEMS contact vias may be formed using mask and etch techniques. Other techniques for forming the MEMS contact vias may also be useful.

Figure 5H:
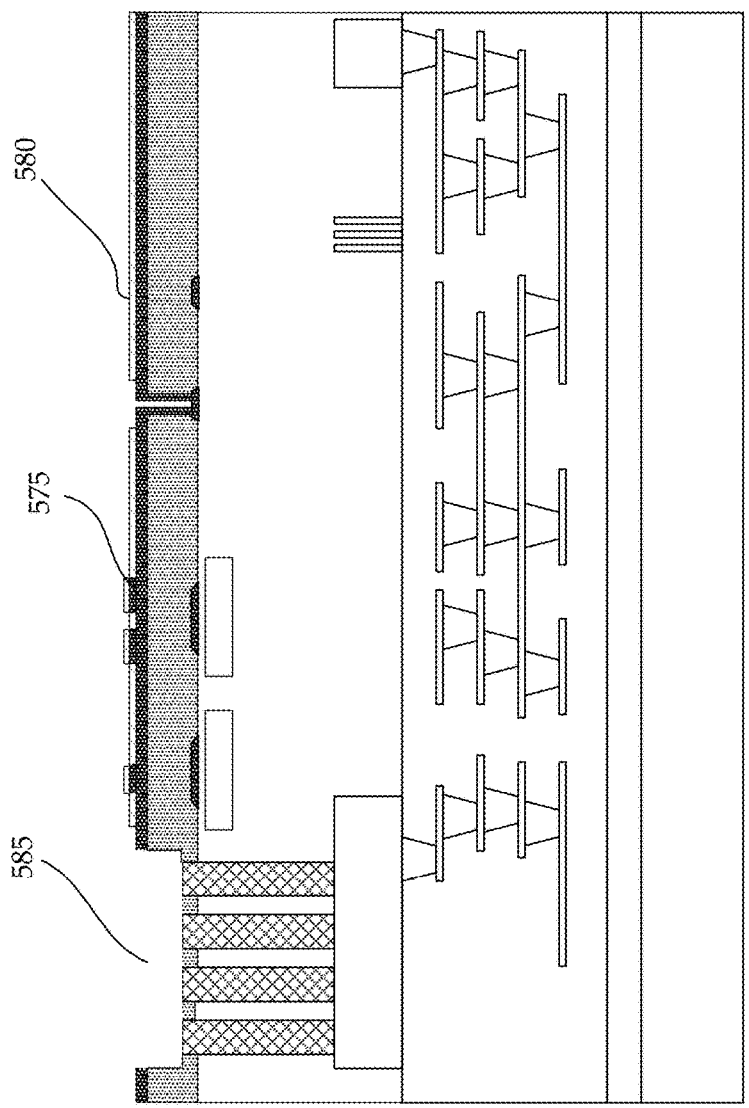

A top electrode 575 of the MEMS stack is formed on the active MEMS layer, as shown in FIG. 5h. The top electrode may be formed by depositing an electrode layer such as a Mo layer. Other types of conductive material suitable for forming the electrode of a MEMS component may also be useful. For example, the top electrode may be formed using a two-step electrode formation. Forming the top electrode using other techniques may also be useful. The electrode layer is patterned to form the top electrode. The top electrode may line the sidewalls and bottom of the MEMS via opening. A dielectric layer 580 may be further deposited over the patterned top electrode. The dielectric layer may be patterned, exposing the MEMS contact vias.

In one embodiment, one or more IC MEMS contact vias 585 is formed in the MEMS stack to expose the portion of the array of via contacts which protrudes into MEMS stack. For example, the IC MEMS contact vias is formed in an upper portion of the MEMS stack to expose a top surface of the array of via contacts which protrudes into the MEMS stack. For example, the IC MEMS contact vias is formed in an upper portion of the active MEMS layer to expose a top surface of the array of via contacts in the active MEMS layer. The IC MEMS contact vias may have a width of about 50-100 um and a height of about 500 nm to 3 um. The IC MEMS contact vias may be formed using mask and etch techniques. Other techniques for forming the IC MEMS contact vias may also be useful.

Figure 5I:
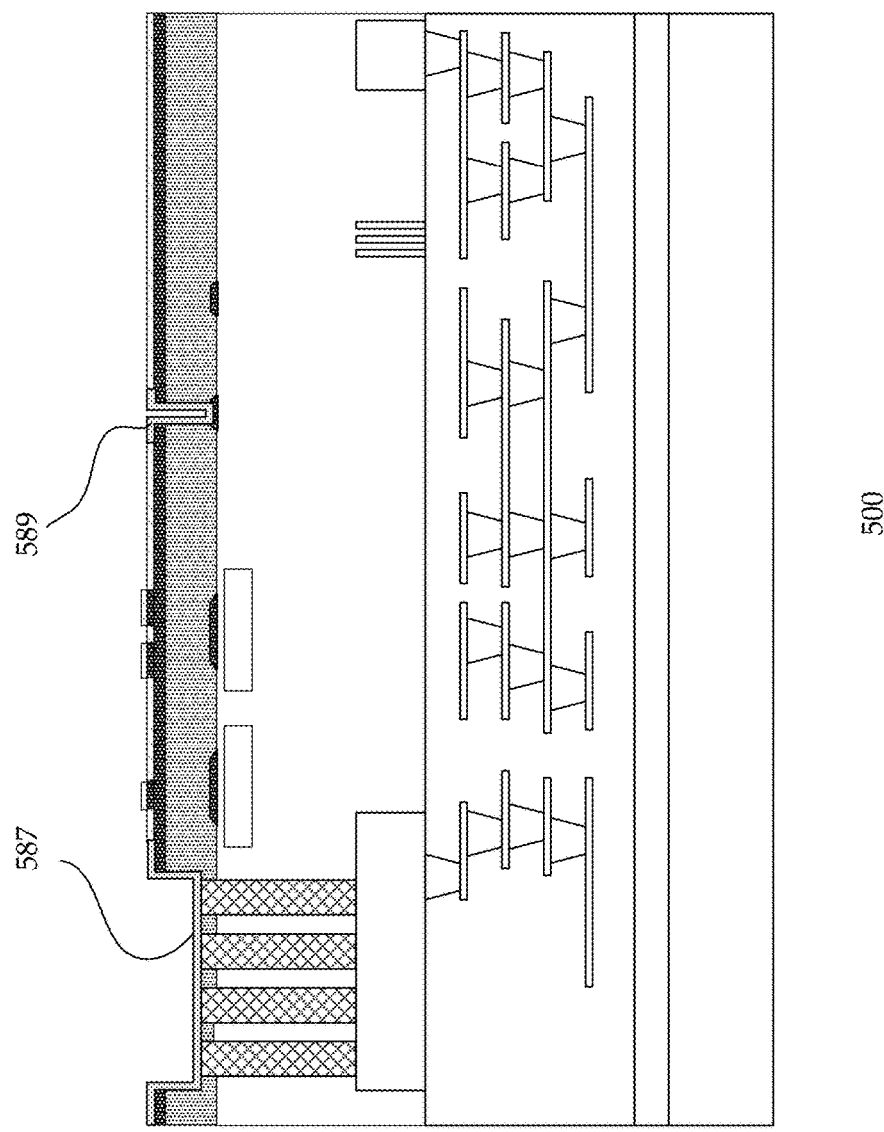

A conductive layer is deposited on the wafer, lining the IC MEMS contact vias and the MEMS contact vias in the MEMS stack. The conductive layer lines the sidewalls and bottom of the IC MEMS contact vias and the MEMS contact vias. The conductive layer is patterned to remove a portion of the conductive material on the top surface of the wafer, forming one or more IC MEMS contacts 587 in the IC MEMS contact vias and MEMS contacts 589 in the MEMS contact vias, as shown in FIG. 5i. The MEMS contacts 589 interconnect the top and bottom electrodes of the MEMS device. As for the IC MEMS contacts 587, it contacts the top electrode of the MEMS stack and the array of via contacts. The IC MEMS contact which is formed over the top surface of the array of via contacts is coupled to the IC interconnect pads by the array of via contacts.

Figure 5J:
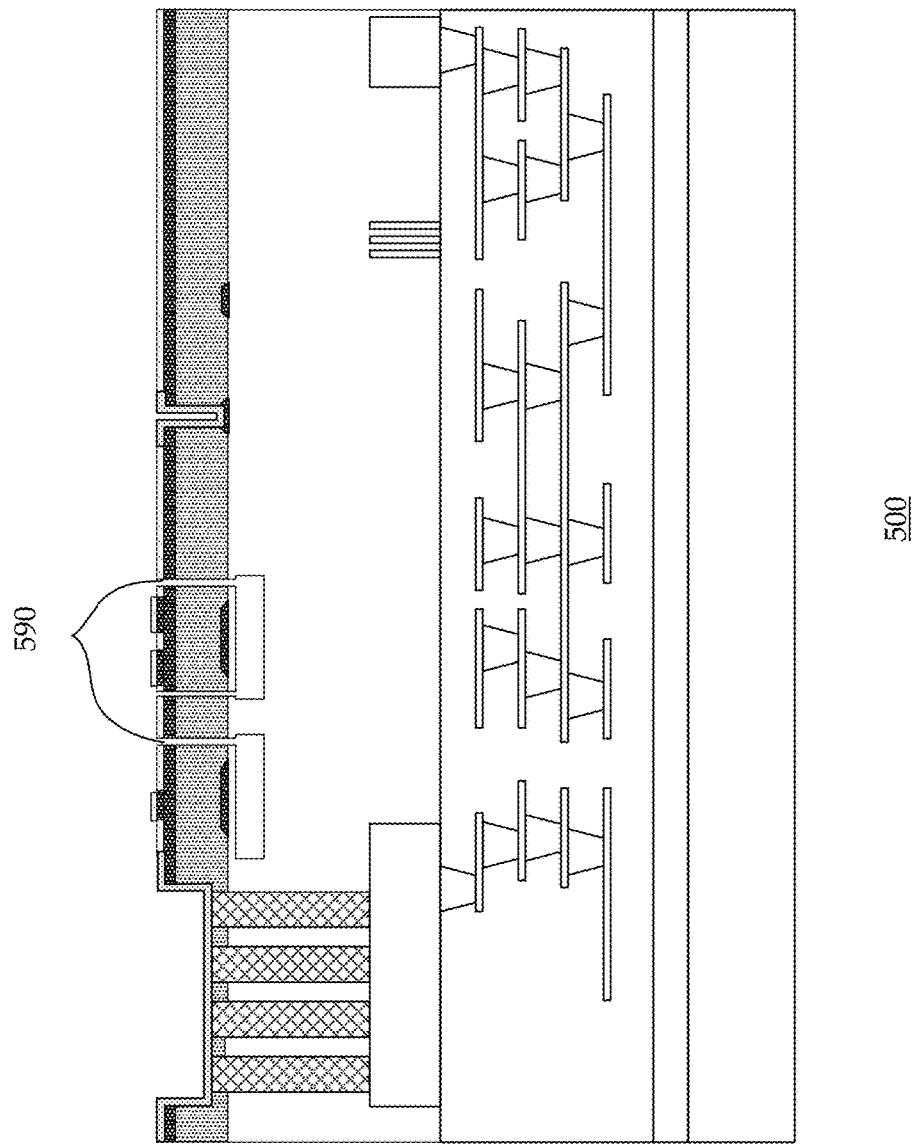

The process continues with forming release slots 590 in the active MEMS layer for the MEMS cavities release etch process, as shown in FIG. 5j. The release slots may be formed by mask and etch technique for example. Other techniques for forming the release slots may also be useful. A release process is then performed to remove the sacrificial material in the sacrificial islands below the MEMS stack, forming one or more lower MEMS cavities. For example, the lower MEMS cavities are formed in the MEMS interposer. For example, the lower MEMS cavities are formed below the active MEMS layer. In one embodiment, a wet etch is performed to form the lower MEMS cavities. An etchant such as $XeF_2$ is employed for the release process. Other types of etchants or etch processes may also be useful. Alternatively, the lower MEMS cavity may be released simultaneously with an upper MEMS cavity in a later step.

Figure 5K:
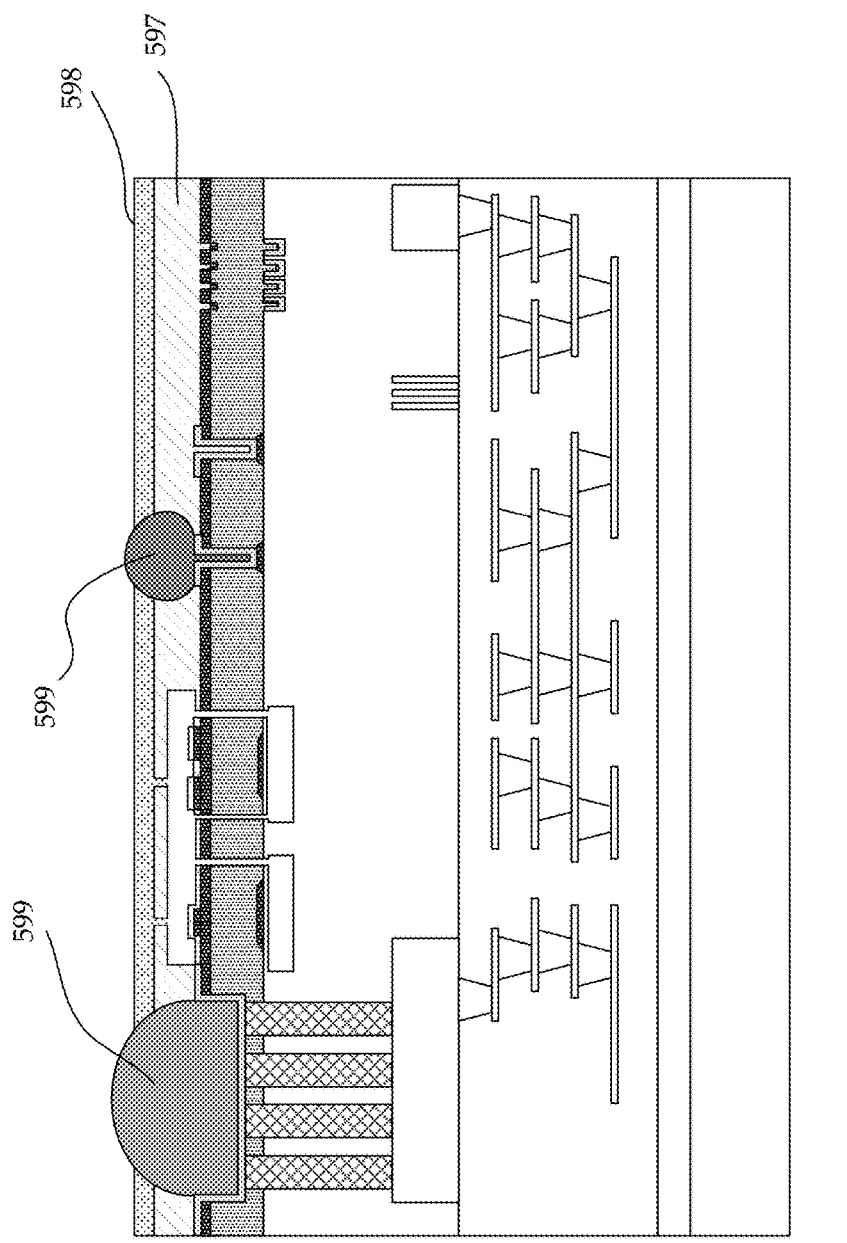

The process continues to complete the formation of the device. For example, a sacrificial layer or islands which correspond to upper MEMS cavity may be formed. An encapsulation may be formed over the device. The encapsulation may be a stack of encapsulation layers. For example, a first encapsulation layer 597 is formed over the top electrode and covering the sacrificial islands for the upper MEMS cavity. The first encapsulation layer may be one or more dielectric layers such as oxides or nitrides. For example, a low temperature process is employed to form the first encapsulation layer. In the case where oxides and nitrides are employed, the nitride layer is formed on the top. Opening may be formed in the first encapsulation layer and a release is performed for the upper MEMS cavity. In other embodiments, the release for the lower and upper MEMS cavities may be performed simultaneously. A second encapsulation layer 598 may be deposited over the first encapsulation layer, as illustrated in FIG. 5k. The second encapsulation layer, for example, may be a sealing for the encapsulation. One or more openings may be formed to deposit contact bumps 599, for example, over one or more of the MEMS contacts in the MEMS contact vias and over one or more of the IC MEMS contacts in the IC MEMS contact vias. Other configurations and processes may also be performed to complete the device.

As described, the IC MEMS contact in the MEMS stack couples the electrodes of the MEMS device to the IC interconnect pads via the array contact in the MEMS interposer.

FIGS. 6a-6g show simplified cross-sectional views of another embodiment of a process 600 for forming a device. The device, for example, is similar to that described in FIG. 2. Common elements may not be described or described in detail. In one embodiment, the process describes forming a monolithic device with a MEMS device formed over an IC. For example, the MEMS device may include one or more MEMS components and the IC may include circuit components.

Figure 6A:
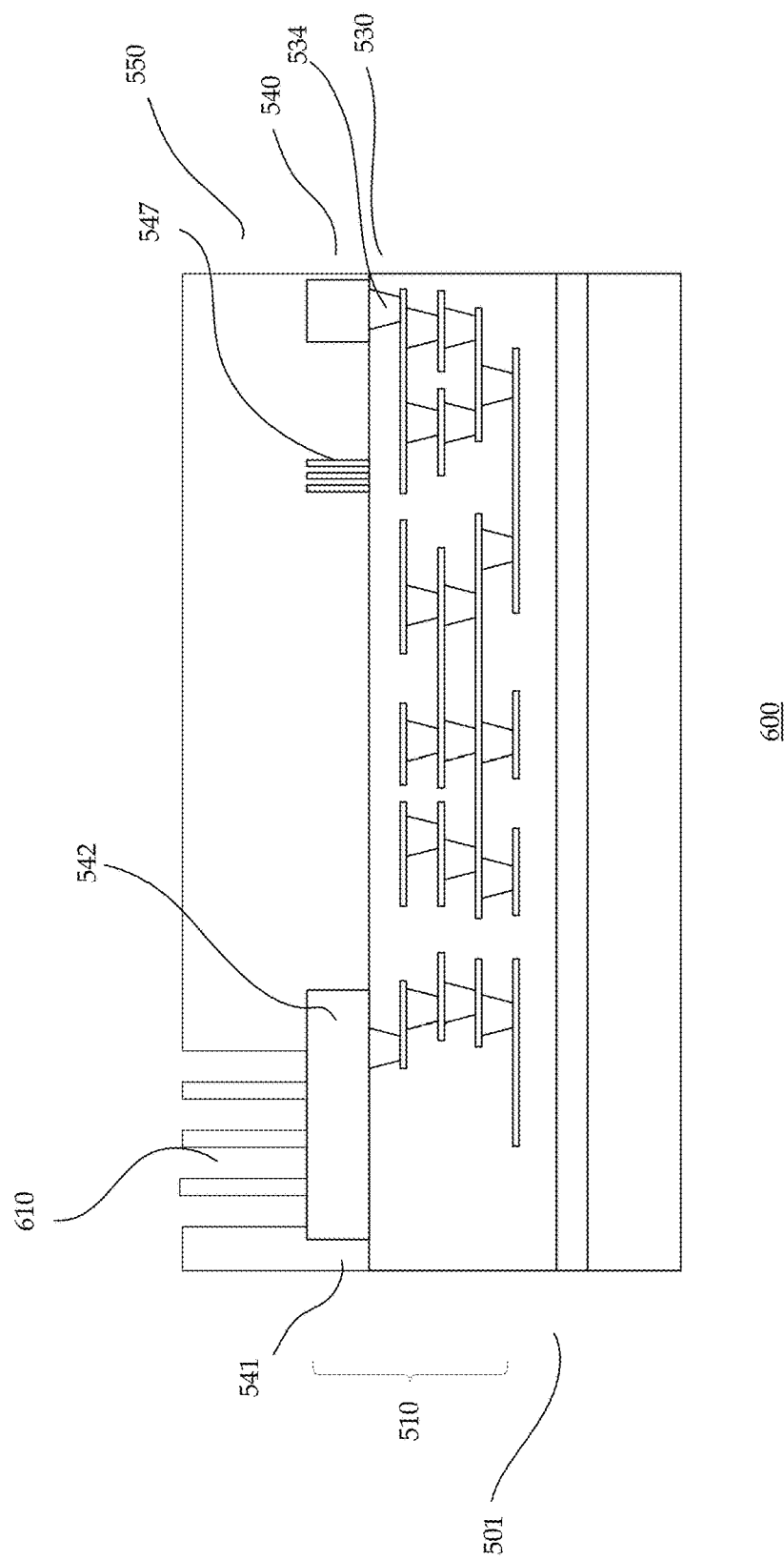
FIGS. 6a-6g show another embodiment of a process for forming a device.

Referring to FIG. 6a, a substrate 501 similar to that described in FIG. 5a is provided. The substrate includes first and second major surfaces. The first major surface of the substrate is processed to form circuit components. In one embodiment, the circuit components are formed using FEOL processing. For example, FEOL processing may be performed on the first major surface of the substrate to form FEOL components such as CMOS transistors. Other types of circuit components may also be formed by the FEOL processing.

BEOL processing is performed after the FEOL processing. The BEOL process includes forming a BEOL dielectric in a BEOL region 510. The BEOL dielectric covers the FEOL components on the first major surface of the substrate. The BEOL dielectric includes a plurality of ILD levels. An ILD level includes a metal dielectric level over a contact dielectric level. The uppermost ILD level, in one embodiment, includes a pad via dielectric level 530. The pad via dielectric level, for example, may be the uppermost dielectric level of the BEOL dielectric. The pad via dielectric level includes via contacts 534. The via contacts, for example, may be Al. Other types of conductive material for the via contacts may also be useful.

A pad level 540 may be formed over the uppermost ILD level. The pad level includes a passivation layer 541 and contact pads 542. For example, the contact pads may be formed to contact the via contacts in the uppermost ILD of the BEOL dielectric. The contact pads may be referred to as the IC interconnect pads in the BEOL region. The passivation layer may be a dielectric layer such as silicon oxide. Other types of dielectric layer may also be useful. In some embodiments, alignment structures 547 may be formed in the passivation level. The alignment mark may be formed simultaneously with the IC interconnect pads. For example, the alignment mark and IC interconnect pads may be formed by depositing and patterning a conductive layer on the uppermost ILD level of the BEOL dielectric. The alignment mark and contact pads, for example, may be Al. Other types of conductive material may also be useful.

In one embodiment, a MEMS device is formed over the IC on the wafer. The MEMS device is formed vertically above the circuit components on the wafer. The MEMS device may be formed in a MEMS region on the wafer. The MEMS region, in one embodiment, is on top of the BEOL region. In one embodiment, the MEMS device includes a MEMS interposer and a MEMS stack. The MEMS interposer is formed over the pad level of the BEOL dielectric. The MEMS interposer includes a MEMS interposer dielectric layer 550 which is deposited over the passivation layer and IC interconnect pads in the passivation layer. For example, a first thickness of the interposer dielectric layer is deposited. In one embodiment, the MEMS interposer dielectric layer is a silicon oxide layer. Providing other types of material which is formed using a low temperature process for the interposer dielectric layer may also be useful. For example, the interposer dielectric layer may be formed of other oxides or nitrides. The MEMS interposer dielectric layer is planarized to provide a planar top surface. For example, a polishing process such as CMP may be employed to planarize the MEMS interposer dielectric layer. Other planarization processes may also be useful. An alignment mark may be formed in the MEMS interposer (not shown). For example, alignment mark trenches may be formed in the MEMS interposer dielectric layer using mask and etch techniques.

In one embodiment, an array of via openings 610 is formed in the MEMS interposer dielectric layer. The array of via openings corresponds to an array of via contacts to be formed in the MEMS interposer. As shown, the array of via openings is formed through the MEMS interposer dielectric layer. For example, via openings with vertical sidewalls are illustrated. The via openings may be formed using mask and etch techniques. For example, a dry etch such as a reactive ion etch (RIE) is performed using an etch mask to form via openings through the MEMS interposer dielectric layer. The via openings extend through the MEMS interposer dielectric layer to expose the IC interconnect pads. For example, the via openings extend through the MEMS interposer dielectric layer to expose the IC interconnect pads. Each via opening, for example, may have a width of about 1 um and a height of about 3 um. Providing via openings with other dimensions may also be useful.

Figure 6B:
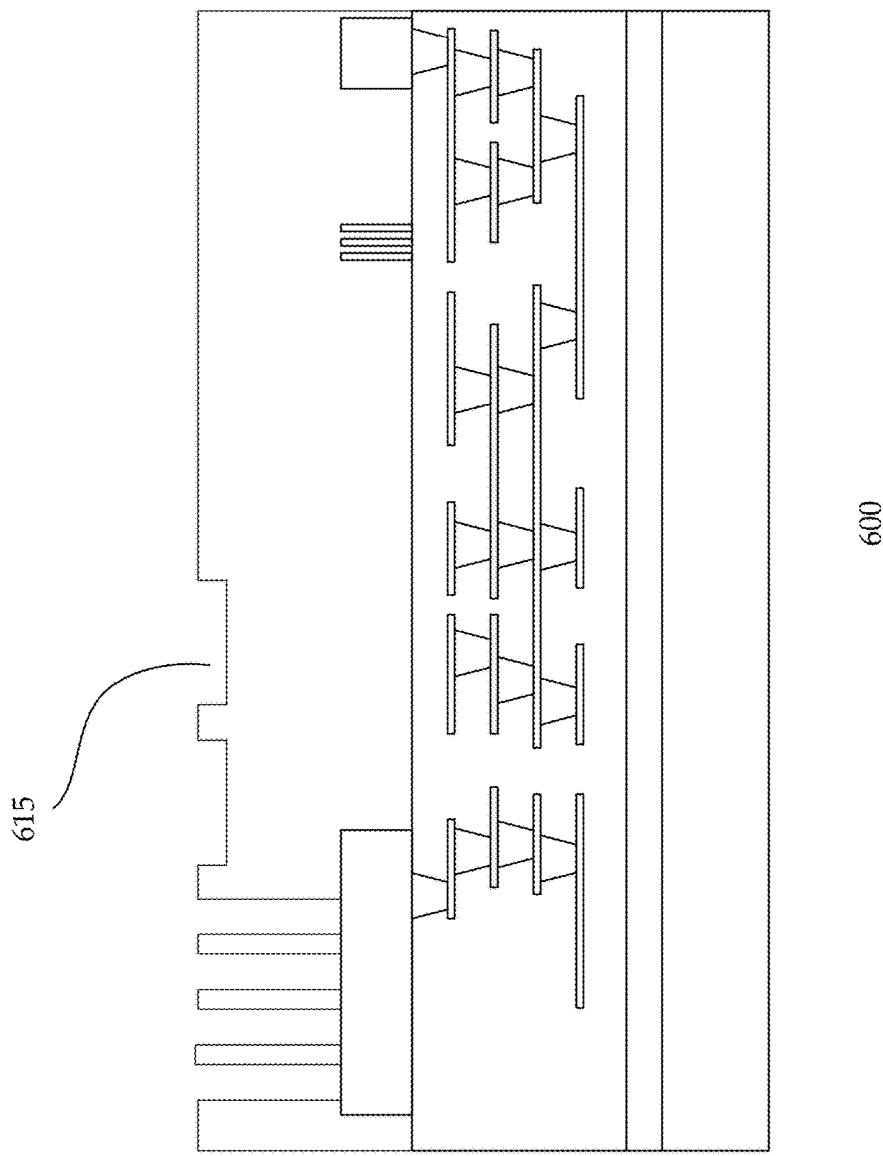

Referring to FIG. 6b, sacrificial islands openings 615 are formed in the MEMS interposer dielectric layer for forming sacrificial islands. The sacrificial island openings correspond to lower MEMS cavities of the MEMS components which are to be formed subsequently. The sacrificial island openings are formed to correspond to the desired dimensions of one or more lower MEMS cavities. For example, the sacrificial island openings may have a width of about 100 um to about 200 um and a height of about 100 nm to 2 um. Providing other widths for the sacrificial islands may also be useful. The sacrificial island openings may be formed using mask and etch techniques such as RIE. Other techniques for forming the sacrificial island openings may also be useful.

Figure 6C:
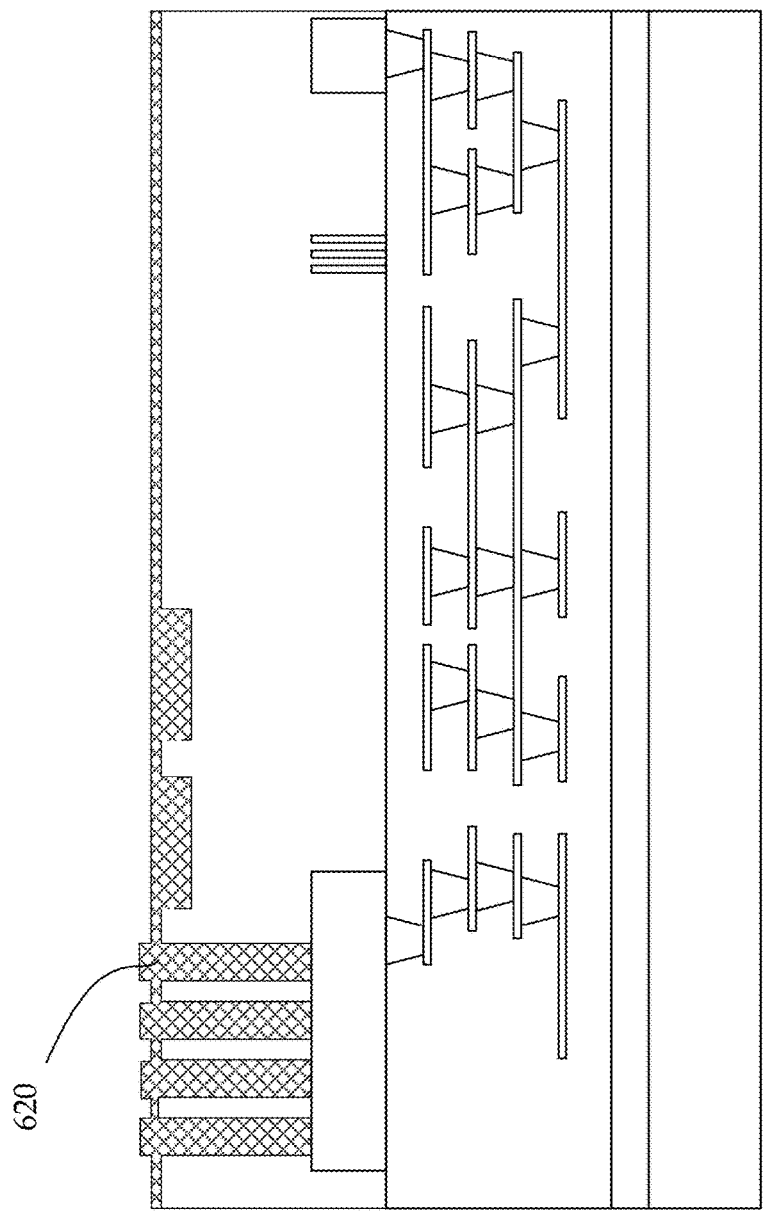

After forming the array of via openings and sacrificial island openings, a conductive material 620, such as tungsten, is deposited over the wafer as shown in FIG. 6c. The conductive material fills the array of via openings and sacrificial island openings. Other conductive materials such as Mo, doped Poly Si or Cu, may also be useful. In the case where alignment mark trenches are formed in interposer dielectric layer, the conductive material fills the trenches as formed earlier, forming the alignment marks. Alternatively, the conductive material in the alignment mark trenches may be etched away, leaving a topography for the alignment mark in the interposer dielectric layer. In some embodiments, a via liner, such as Co and Ti, may be deposited to line the via openings and sacrificial island openings prior to forming the conductive layer (not shown).

Figure 6D:
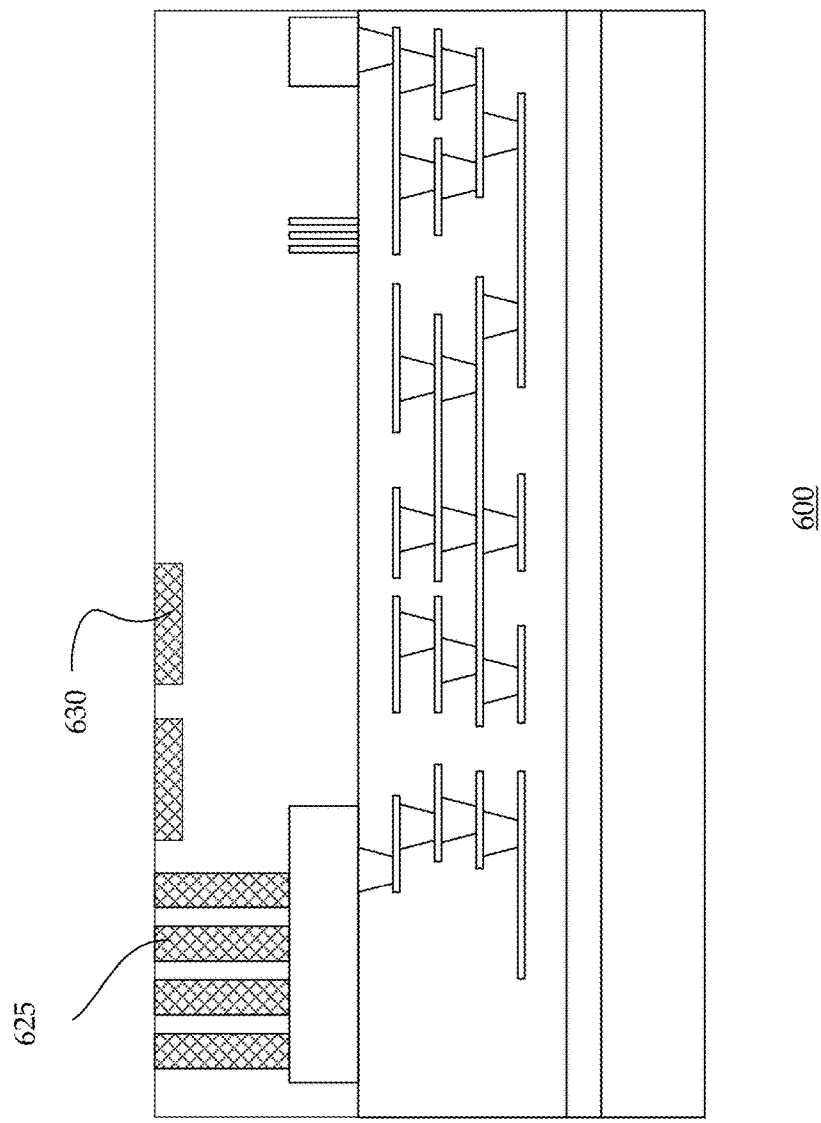

Referring to FIG. 6d, a planarization process, such as CMP, is performed to remove excess conductive material and exposing a top surface of the MEMS interposer dielectric layer, forming a substantially planar top surface. As shown, an array of via contacts 625 and sacrificial islands 630 are formed in the MEMS interposer dielectric layer. For example, the via contacts in the array and sacrificial islands have a coplanar top surface after the planarization process. Filling the via openings and sacrificial island openings with the same conductive material (or fill material) in the same deposition step as described provides the array of via contacts and sacrificial islands which is formed of the same material.

The array of via contacts which contacts the IC interconnect pad, as illustrated, couples the circuit components such as the CMOS transistors on the substrate to the subsequently formed MEMS device. As for the sacrificial islands, they are used for forming MEMS cavities for the one or more MEMS components in a subsequent step. For example, the sacrificial islands serve as a sacrificial layer for forming lower MEMS cavities of one or more filters in a release process.

The process continues with depositing another dielectric layer of the MEMS interposer dielectric on the wafer. The MEMS interposer dielectric layer, for example, is deposited to cover the sacrificial islands and via contacts prior to forming the MEMS stack. For example, the dielectric layer is deposited to sufficiently cover the sacrificial islands. The layer of the MEMS interposer dielectric may be the same material as that used for the MEMS interposer dielectric layer prior to forming the sacrificial islands. Providing different dielectric layers may also be useful. For example, the MEMS interposer dielectric layer over the BEOL region may be formed of a stack of dielectric layers. The stack of dielectric layers may be formed of the same material or different material. A planarization process such as CMP may be performed to provide a substantially planar top surface of the MEMS interposer dielectric layer.

Figure 6E:
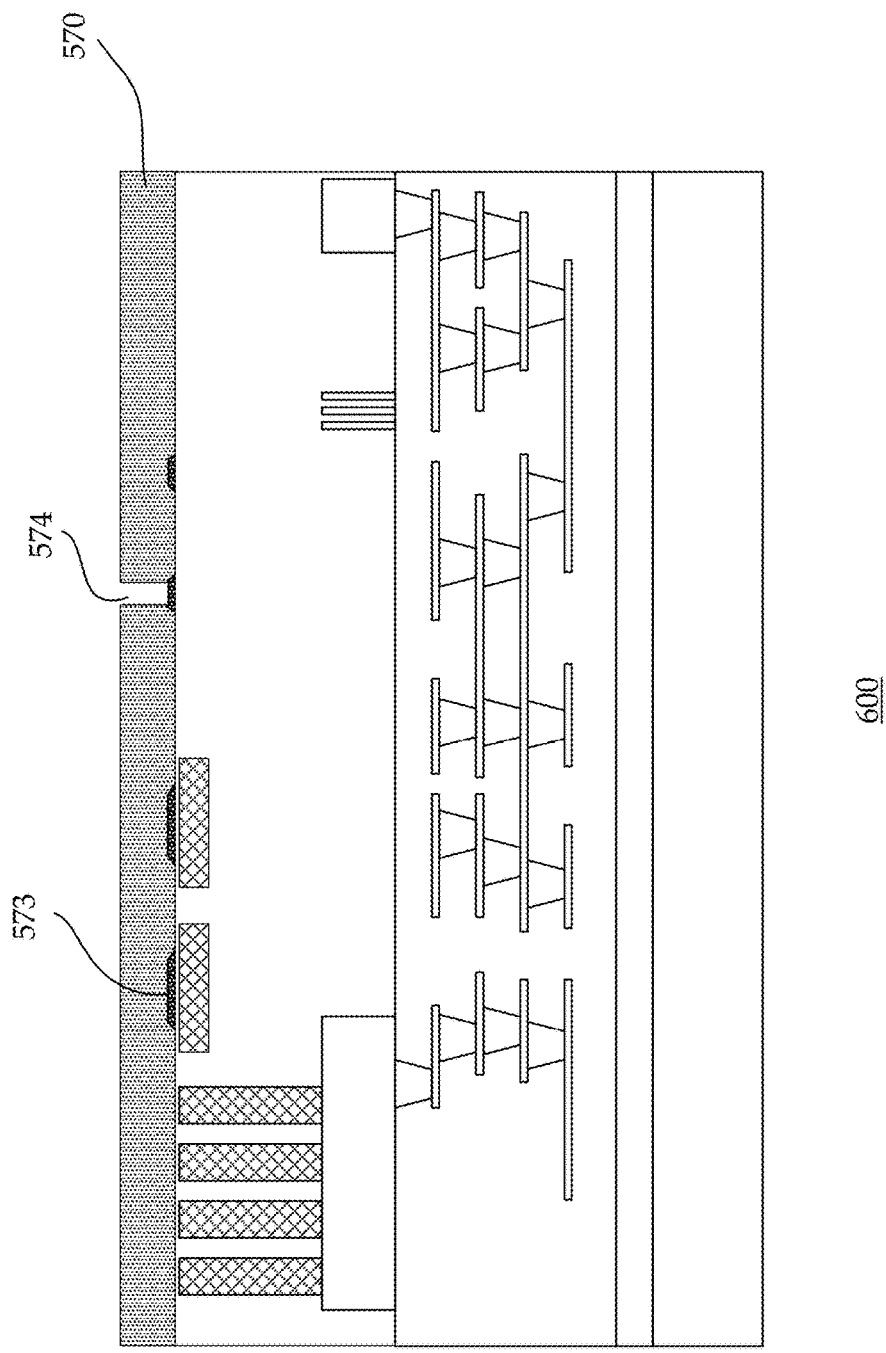

The process continues with forming the MEMS stack. Top and bottom electrodes and an active MEMS layer 570 are formed on the MEMS interposer, similar to the process step described in FIG. 5g. The patterned bottom electrode 573 of the MEMS device is formed, followed by deposition of the active MEMS layer as illustrated in FIG. 6e. The active MEMS layer may be a piezoelectric layer. The active MEMS layer covers the MEMS interposer and the patterned bottom electrode on the MEMS interposer. One or more MEMS contact vias 574 may be formed in the active MEMS layer. A MEMS contact via extends from a top surface of the active MEMS layer to expose a patterned bottom electrode. The MEMS contact vias may be formed using mask and etch techniques. Other techniques for forming the MEMS contact vias may also be useful.

Figure 6F:
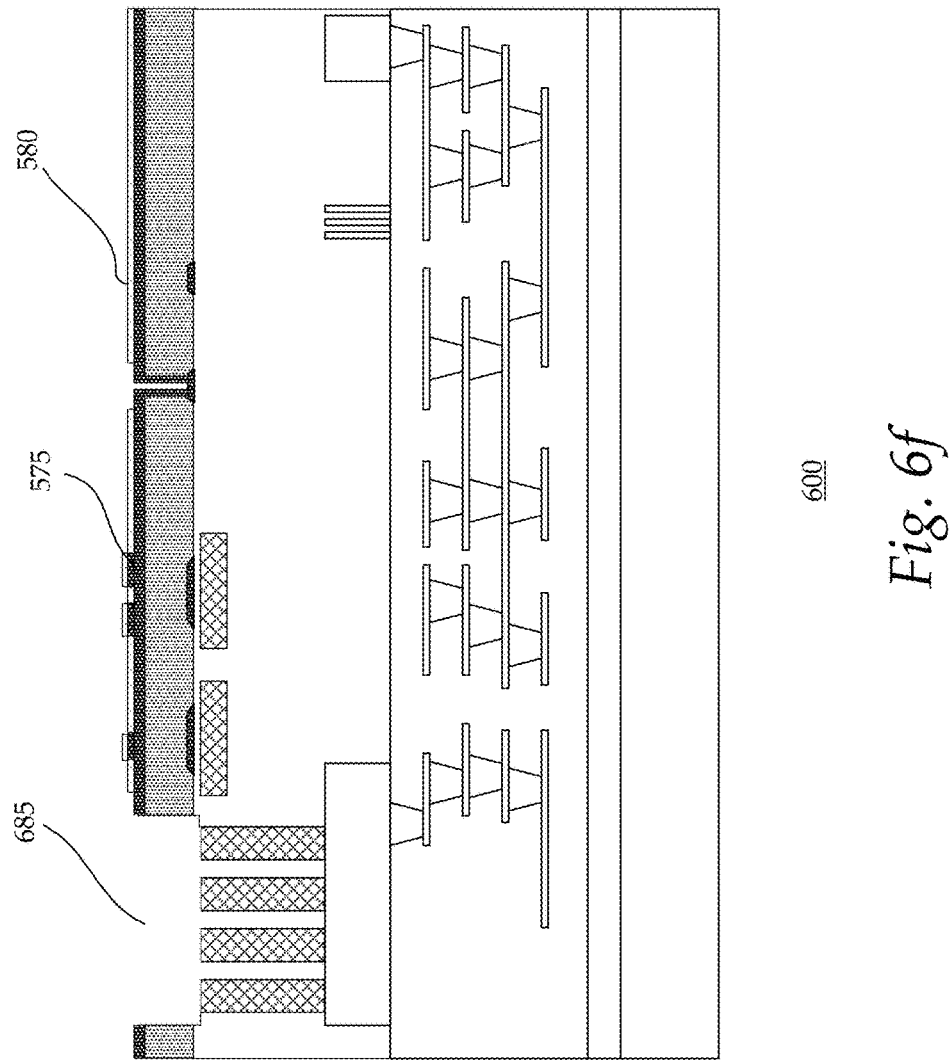

Similar to the process described in FIG. 5h, the patterned top electrode 575 of the MEMS device is formed on the active MEMS layer as shown in FIG. 6f. The top electrodes may be formed by depositing an electrode layer such as a Mo layer. Other types of conductive material suitable for forming the electrode of a MEMS component may also be useful. The electrode layer is patterned to form the top electrode. The top electrode lines the sidewalls and bottom of the MEMS via opening. A dielectric layer 580 is deposited over the patterned top electrode. The dielectric layer may be patterned, exposing the MEMS contact vias.

In one embodiment, one or more IC MEMS contact vias 685 is formed to expose the array of via contacts. Referring to FIG. 6f, an IC MEMS contact via is formed through the MEMS stack. The IC MEMS contact via extends through the top and bottom surfaces of the active MEMS layer to expose a top surface of the via contacts of the array. In some cases, the IC MEMS contact via may be recessed slightly into a portion of the MEMS interposer to expose the array of via contacts. The IC MEMS contact via, for example, may have a width of about 50-100 um and a height of about 500 nm to 3 um. The IC MEMS contact via may be formed using mask and etch techniques. Other techniques for forming the IC MEMS contact via may also be useful.

Figure 6G:
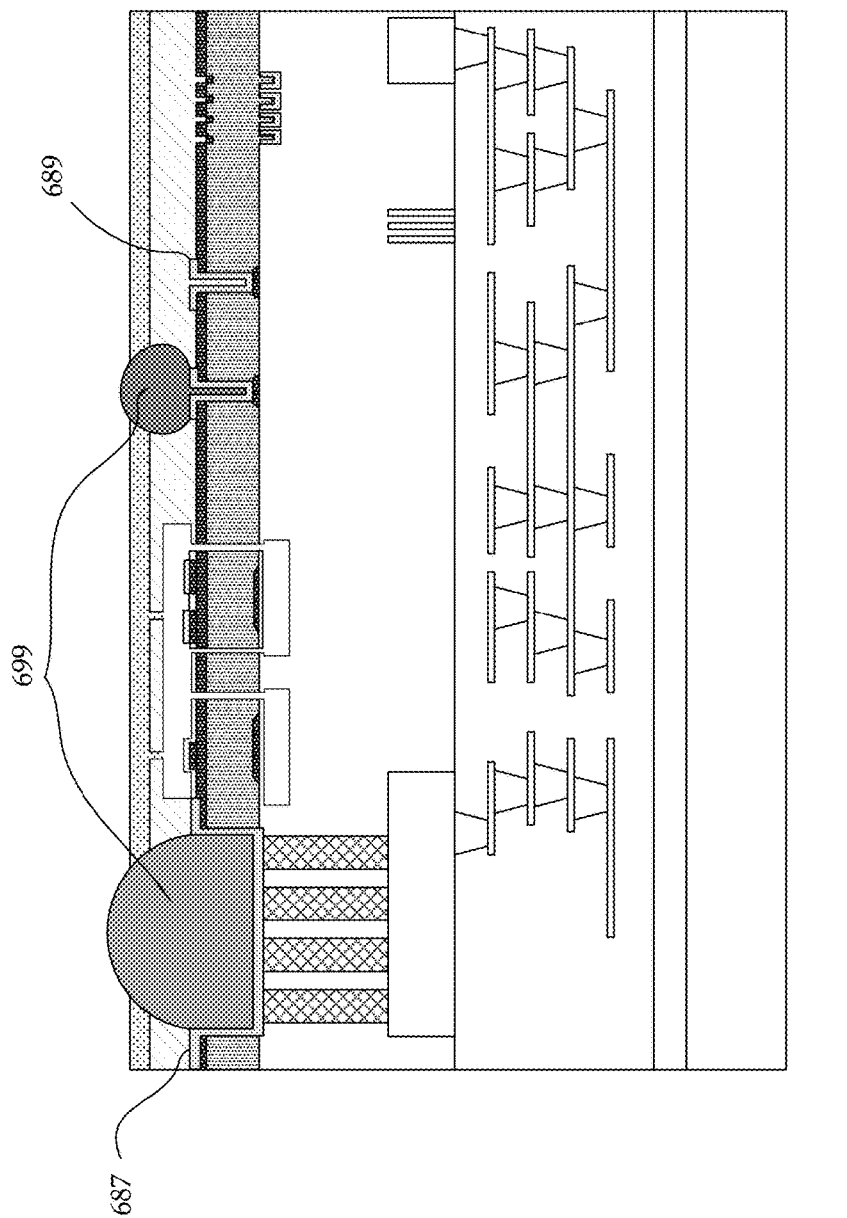

A conductive layer is deposited on the wafer, lining the IC MEMS contact vias and the MEMS contact vias. The conductive layer lines the sidewalls and bottom of the IC MEMS contact vias and the IC MEMS contact vias. The conductive layer is patterned to remove a portion of the conductive material on the top surface of the wafer, forming an IC MEMS contact 687 in the IC MEMS contact vias and MEMS contacts 689 in the MEMS contact vias, as illustrated in FIG. 6g. The MEMS contacts 689 interconnect the top and bottom electrodes of the MEMS stack. As for the IC MEMS contacts, they contact the top electrode of the MEMS stack and the array of via contacts. The IC MEMS contact which is formed over the top surface of the array of via contacts is coupled to the IC interconnect pads by the array of via contacts.

The process continues with forming release slots in the active MEMS layer for the MEMS cavities release etch process. The release slots may be formed by mask and etch technique for example. Other techniques for forming the release slots may also be useful. A release process may be performed to remove the sacrificial material in the sacrificial islands, forming MEMS cavities. For example, lower MEMS cavities are formed in the MEMS interposer. For example, a wet etch is performed to form the lower MEMS cavities. Alternatively, the lower MEMS cavity may be released simultaneously with an upper MEMS cavity in a later step.

The process continues to complete the formation of the device. For example, a sacrificial layer or islands which correspond to upper MEMS cavity may be formed. An encapsulation may be formed over the device. The encapsulation may be a stack of encapsulation layers. For example, a first encapsulation layer is formed over the top electrode and covering the sacrificial islands for the upper MEMS cavity. The first encapsulation layer may be one or more dielectric layers such as oxides or nitrides. Opening may be formed in the first encapsulation layer and a release is performed for the upper and/or lower MEMS cavities depending on process design. A second encapsulation layer may be deposited over the first encapsulation layer. The second encapsulation layer, for example, may be a sealing for the encapsulation. One or more openings may be formed to deposit contact bumps 699, for example, over one or more of the MEMS contacts in the MEMS contact vias and over one or more of the IC MEMS contacts in the IC MEMS contact vias. Other configurations and processes may also be performed to complete the device.

As described, the IC MEMS contacts in the MEMS stack couple the electrodes of the MEMS device to the IC interconnect pads via the array of via contacts in the MEMS interposer.

FIGS. 7a-7d show simplified cross-sectional views of another embodiment of a process 700 for forming a device. The device, for example, is similar to that described in FIG. 3. Common elements may not be described or described in detail. In one embodiment, the process describes forming a monolithic device with a MEMS device formed over an IC.

For example, the MEMS device may include one or more MEMS components and the IC may include circuit components.

Figure 7A:
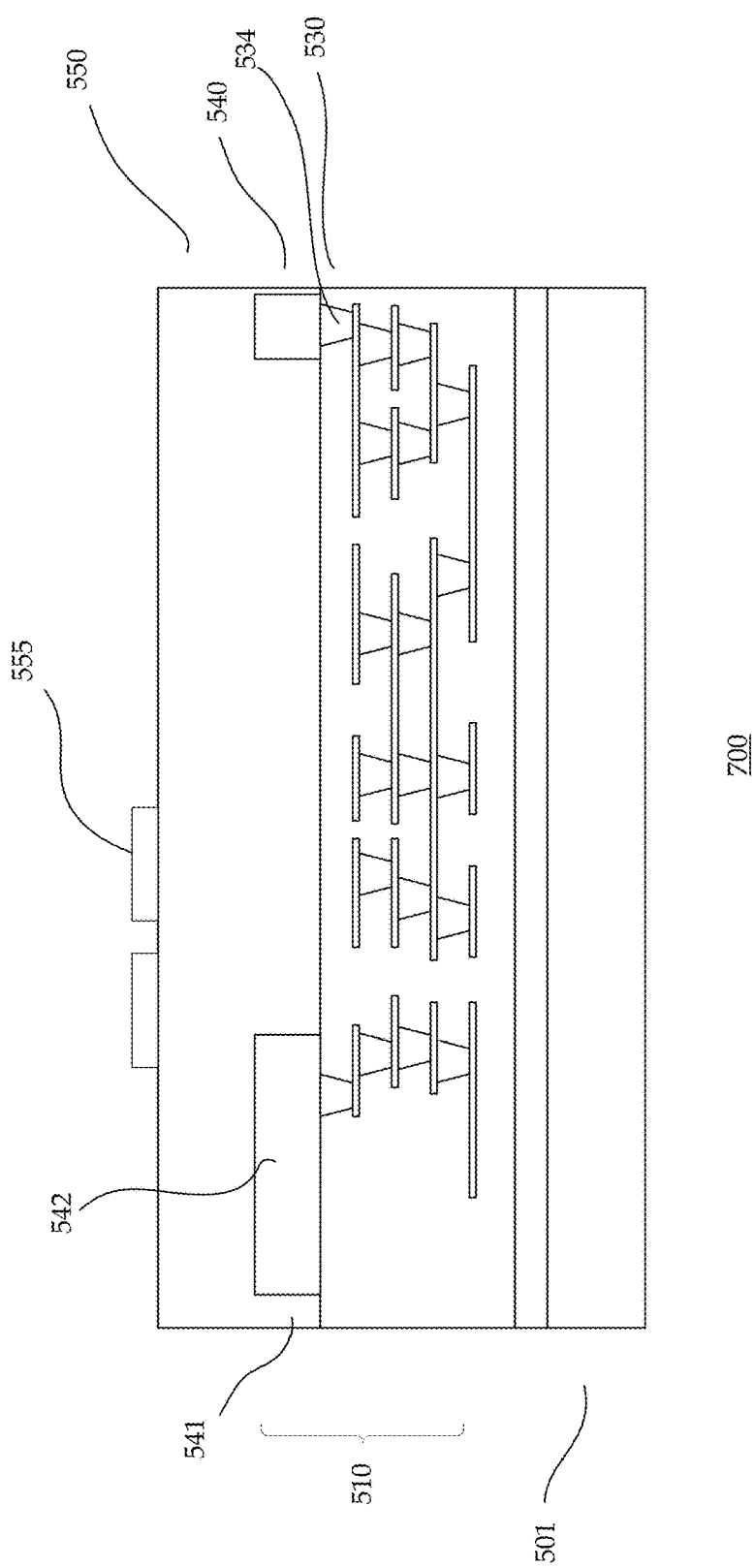
FIGS. 7a-7d show yet another embodiment of a process for forming a device.

Referring to FIG. 7a, a substrate 501 similar to that described in FIG. 5a is provided. The substrate includes first and second major surfaces. The first major surface of the substrate is processed to form circuit components. For example, FEOL processing may be performed on the first major surface of the substrate to form FEOL components such as CMOS transistors. Other types of circuit components may also be formed. BEOL processing is performed after the FEOL processing. The BEOL process includes forming a BEOL dielectric in a BEOL region 510. The BEOL dielectric covers the FEOL components on the first major surface of the substrate. The BEOL dielectric includes a plurality of ILD levels.

The uppermost ILD level, in one embodiment, includes a pad via dielectric level 530. The pad via dielectric level, for example, may be the uppermost dielectric level of the BEOL dielectric. The pad via dielectric level includes via contacts 534. The via contacts, for example, may be Al. Other types of conductive material for the via contacts may also be useful. Similar to the device in FIG. 5a, a pad level 540 may be formed over the uppermost ILD level. The pad level includes a passivation layer 541 and contact pads 542. In some embodiments, alignment structures may be formed in the passivation level (not shown). The alignment mark may be formed simultaneously with the contact pads.

The wafer is processed to form a MEMS device. The MEMS device is formed vertically above the circuit components on the wafer. The MEMS device may be formed in a MEMS region on the wafer. The MEMS region, in one embodiment, is on top of the BEOL region. In one embodiment, the MEMS device includes a MEMS interposer and a MEMS stack. The MEMS interposer is formed over the pad level of the BEOL dielectric. The MEMS interposer includes a MEMS interposer dielectric layer 550 which is deposited over the passivation layer and IC interconnect pads in the passivation layer. For example, a first thickness of the interposer dielectric layer is deposited. The MEMS interposer dielectric layer may be planarized to provide a planar top surface.

Process steps similar to FIGS. 5b-5c may be performed. For example, sacrificial islands 555 are formed on the first thickness of the interposer dielectric layer. After forming the sacrificial islands, another dielectric layer of the MEMS interposer dielectric is deposited to cover the sacrificial islands. For example, a second thickness of the MEMS interposer dielectric layer is deposited to sufficiently cover the sacrificial islands. The dielectric layer may be the same material as that used for forming the first thickness of the MEMS interposer dielectric layer prior to forming the sacrificial islands. Providing different dielectric layers may also be useful. The MEMS interposer dielectric layer deposited on the BEOL dielectric, for example, may be formed of a stack of dielectric layers. The stack of dielectric layers may be formed of the same material or different material. A planarization process such as CMP may be performed to provide a substantially planar top surface of the MEMS interposer dielectric layer. The MEMS interposer dielectric layer, for example, just covers a top surface of the sacrificial islands. Additionally, an alignment mark may be formed in the MEMS interposer dielectric layer (not shown). For example, alignment mark trenches may be formed in the dielectric layer using mask and etch techniques.

Figure 7B:
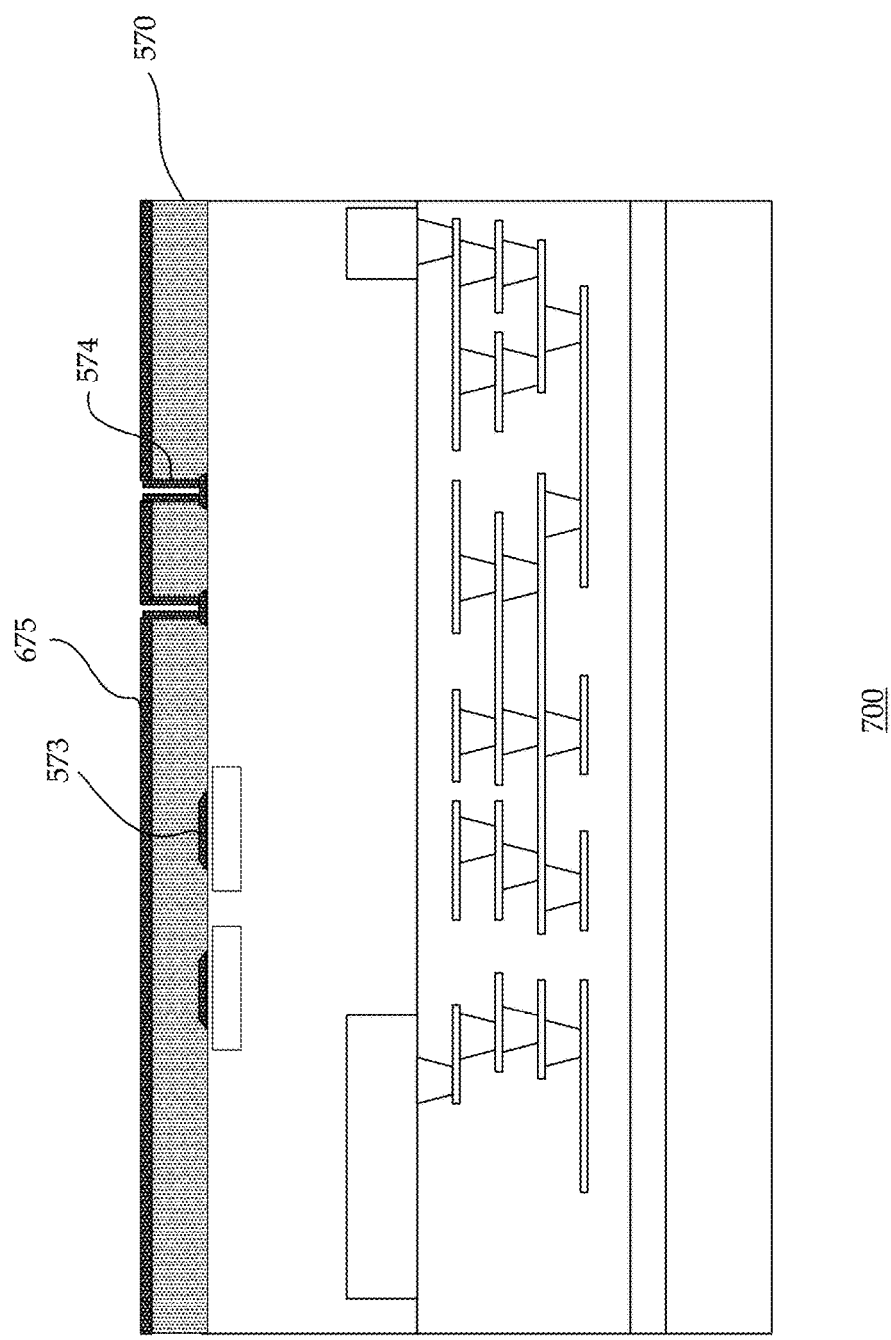

The process continues with forming the MEMS stack. Top and bottom electrodes and an active MEMS layer 570 are formed, similar to the process steps described in FIGS. 5g-5h. As shown in FIG. 7b, a bottom electrode 573 of the MEMS stack is patterned on top of the MEMS interposer, followed by deposition of the active MEMS layer 570. The active MEMS layer covers the MEMS interposer dielectric layer and the patterned bottom electrode on the MEMS interposer dielectric layer. One or more MEMS contact vias 574 may be formed in the active MEMS layer. A MEMS contact via extends through the active MEMS layer from a top surface of the active MEMS layer to expose a patterned bottom electrode.

The top electrode of the MEMS device is formed on the active MEMS layer. The top electrodes may be formed by depositing an electrode layer 675 such as a Mo layer. Other types of conductive material suitable for forming the electrode of a MEMS component may also be useful. The electrode layer is patterned to form the top electrode. A dielectric layer 580 is deposited over the patterned top electrode. The dielectric layer may be patterned, exposing the MEMS contact vias.

Figure 7C:
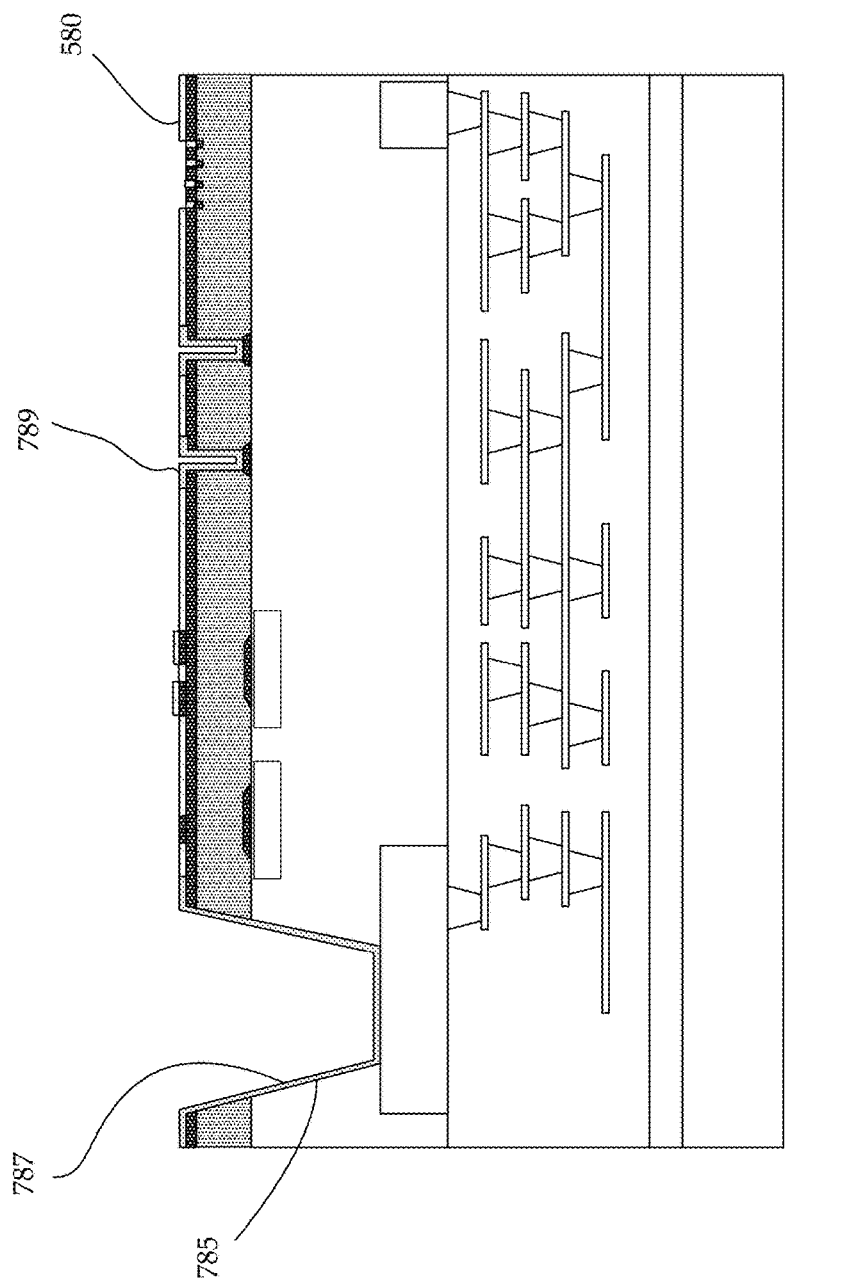

In one embodiment, one or more IC MEMS contact vias are formed through the MEMS stack and MEMS interposer to expose the IC interconnect pads. Referring to FIG. 7c, an IC MEMS contact via 785 is formed through the MEMS stack and MEMS interposer. The IC MEMS contact via extends through the MEMS stack and MEMS interposer to expose the contacts pads. For example, the IC MEMS contact via extends through the entire depth of the MEMS interposer dielectric layer and the MEMS active layer. The IC MEMS contact via may have a slanted sidewall profile. The IC MEMS contact via, for example, may have a top width of about 50-100 um with an angle profile or slope of about 75 degrees and a height of about 3 um to 5 um. Other dimensions and configurations for the IC MEMS contact via may also be useful. For example, IC MEMS contact via may have a vertical sidewall profile.

A conductive layer is deposited on the wafer, lining the IC MEMS contact via and the MEMS contact vias. The conductive layer lines the sidewalls and bottom of the IC MEMS contact vias and the MEMS contact vias. The conductive layer may have a thickness, for example, of about 0.5 um to 2 um. Other thicknesses may also be useful. The conductive layer may be, for example, Al. Providing other conductive material may also be useful. The conductive layer is patterned to remove a portion of the conductive material on the top surface of the wafer, forming an IC MEMS contact 787 in the IC MEMS contact via 785 and MEMS contacts 789 in the MEMS contact vias. The MEMS contacts 789 interconnect the top and bottom electrodes of the MEMS stack. As for the IC MEMS contact 787, it contacts the top electrode of the MEMS stack and the IC interconnect pad.

Figure 7D:
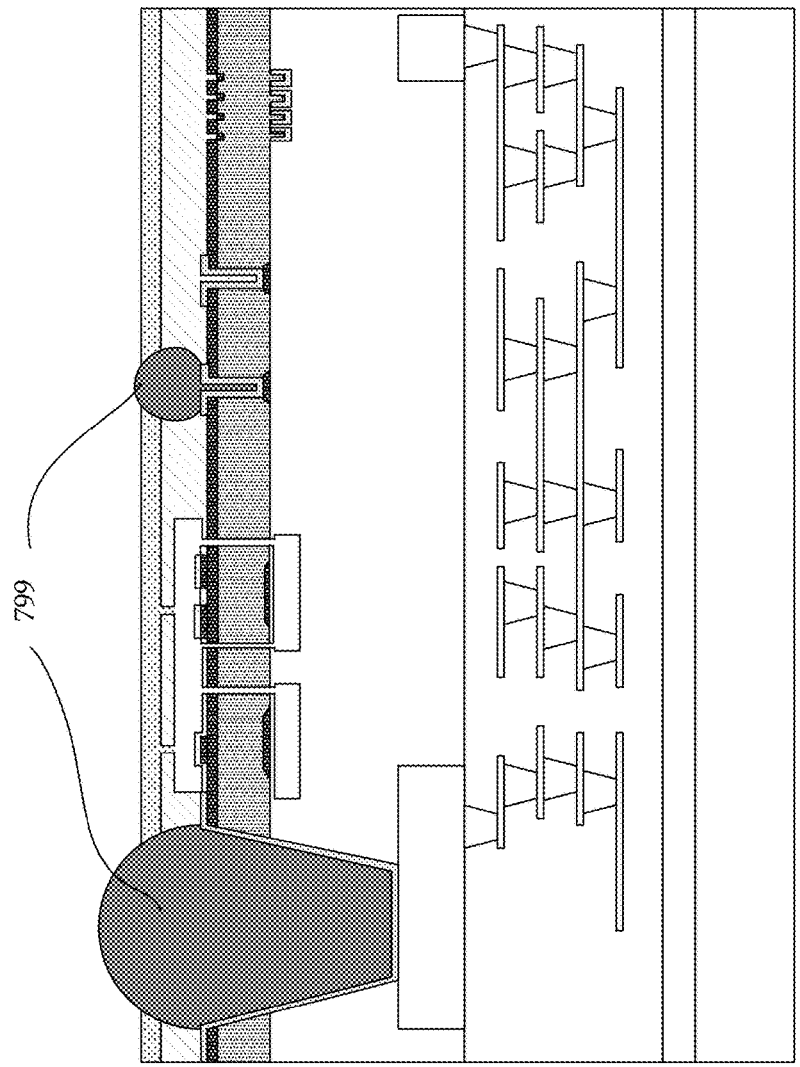

The process continues with forming the MEMS device such as forming release slots in the active MEMS layer for the MEMS cavities release etch process. A release process may be performed to remove the sacrificial material in the sacrificial islands, forming MEMS cavities. For example, lower MEMS cavities are formed in the MEMS interposer. Alternatively, the lower MEMS cavity may be released simultaneously with an upper MEMS cavity in a later step. A sacrificial layer or islands which correspond to upper MEMS cavity may be formed on top of the MEMS stack, followed by an encapsulation over the device. The encapsulation may be a stack of encapsulation layers. For example, a first encapsulation layer is formed over the top electrode and covering the sacrificial islands for the upper MEMS cavity. Openings may be formed in the first encapsulation layer and a release is performed for the upper and/or lower MEMS cavities depending on process design. A second encapsulation layer may be deposited over the first encapsulation layer. The second encapsulation layer, for example, may be a sealing for the encapsulation. One or more openings may be formed to deposit contact bumps 799, for example, over one or more of the MEMS contacts in the MEMS contact vias and over one or more of the IC MEMS contacts in the IC MEMS contact via, as illustrated in FIG. 7d. Other configurations and processes may also be performed to complete the device.

FIGS. 8a-d show simplified cross-sectional views of another embodiment of a process 800 for forming a device. The device, for example, is similar to that described in FIG. 4. Common elements may not be described or described in detail. In one embodiment, the process describes forming a monolithic device with a MEMS device formed over an IC. For example, the MEMS device may include one or more MEMS components and the IC may include circuit components.

Figure 8A:
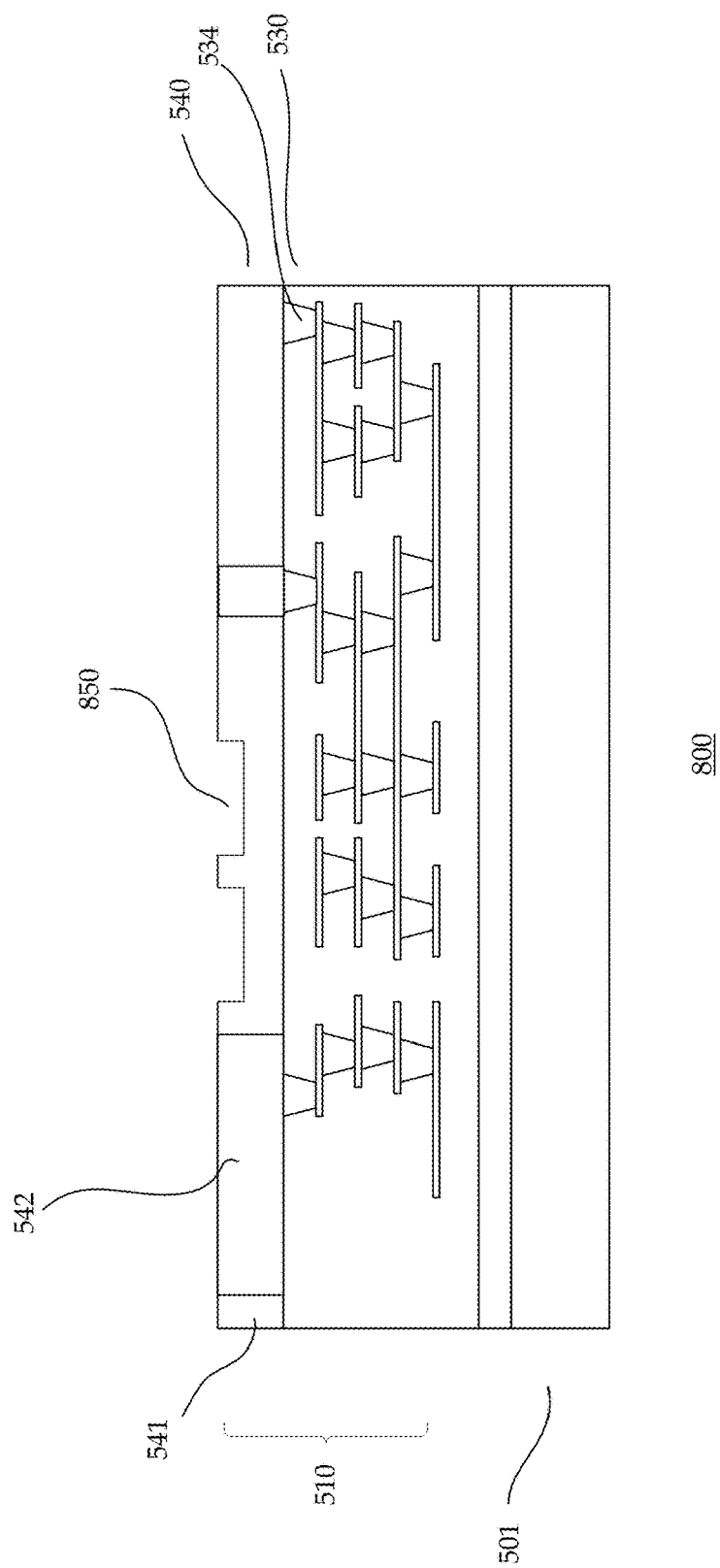
FIGS. 8a-8d show still another embodiment of a process for forming a device.

Referring to FIG. 8a, a substrate 501 similar to that described in FIG. 5a is provided. The first major surface of the substrate is processed to form circuit components. For example, FEOL processing may be performed on the first major surface of the substrate. BEOL processing is performed after the FEOL processing. The BEOL process includes forming a BEOL dielectric in a BEOL region 510. The BEOL dielectric covers the FEOL components on the first major surface of the substrate. The BEOL dielectric includes a plurality of ILD levels.

The uppermost ILD level includes a pad via dielectric level 530. The pad via dielectric level, for example, may be the uppermost dielectric level of the BEOL dielectric. The pad via dielectric level includes via contacts 534. Similar to the device in FIG. 5a, a pad level 540 may be formed over the uppermost ILD level. The pad level includes a passivation layer 541 and IC interconnect pads 542. In some embodiments, alignment marks may be formed in the passivation level (not shown). The alignment marks may be formed simultaneously with the contact pads.

The wafer is processed to form a MEMS device. The MEMS device is formed vertically above the circuit components on the wafer. The MEMS device may be formed in a MEMS region on the wafer. The MEMS region, in one embodiment, is on top of the BEOL region. In one embodiment, one or more openings 850 for sacrificial islands are formed in the passivation layer. The openings for the sacrificial islands correspond to lower MEMS cavities to be formed for one or more MEMS components. The openings are patterned to correspond to the desired dimensions of the lower MEMS cavities. For example, each opening may have a width of about 100-200 um. Providing other widths for the openings for the sacrificial islands may also be useful. The openings may be formed, for example, by mask and etch techniques. Other techniques for forming the openings may also be useful.

Figure 8B:
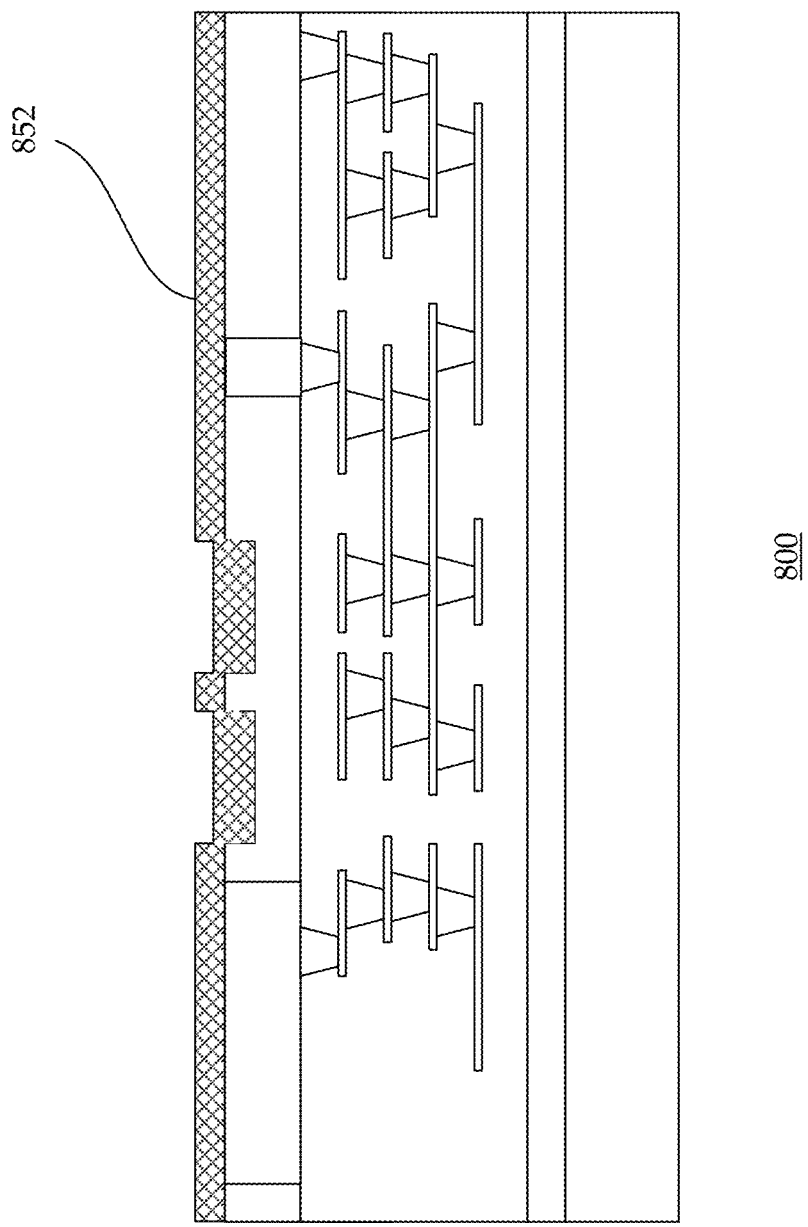
Figure 8C:
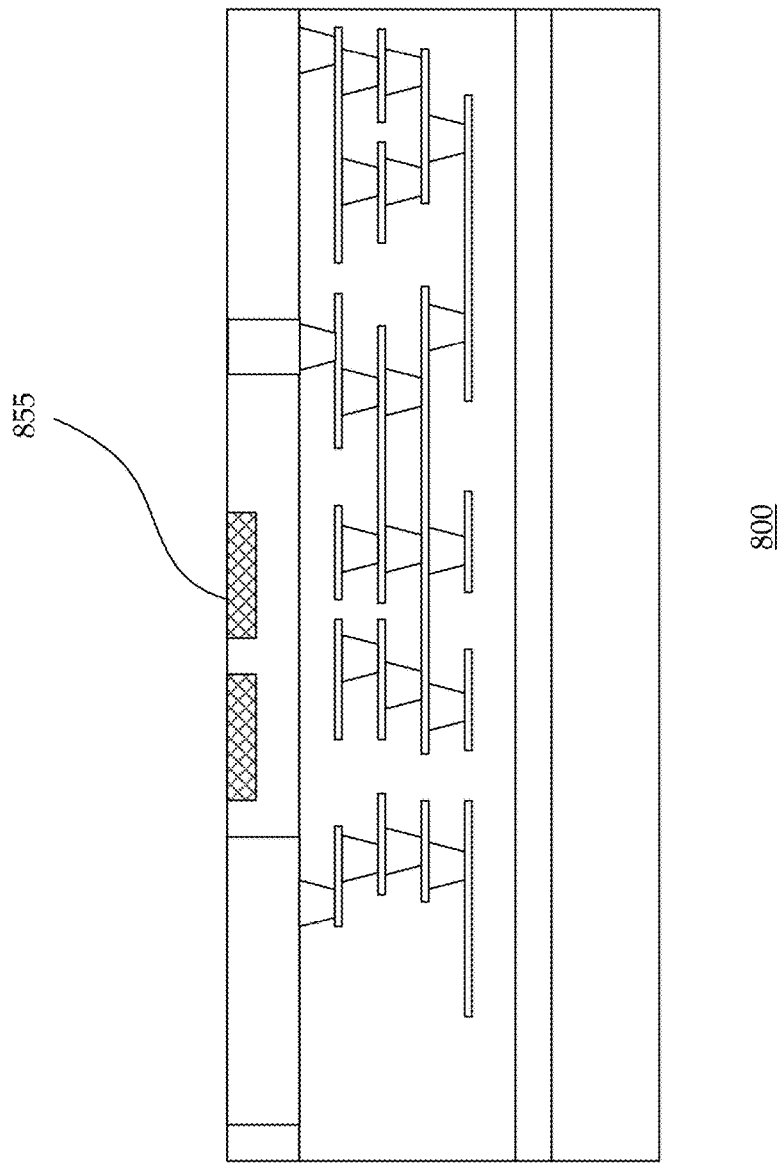

A sacrificial layer 852 is deposited over the wafer, filling the openings for the sacrificial islands as shown in FIG. 8b. The sacrificial layer, for example, may be amorphous Si (A-Si). Other low temperature material formed in a low temperature process may also be useful. For example, the sacrificial layer may be a Poly Si, Mo, W, Ge. A planarization process such as CMP may be performed to remove the excess material of the sacrificial layer, forming the sacrificial islands 855 as shown in FIG. 8c. The planarization process forms a substantially coplanar top surface between the sacrificial islands and the passivation layer.

Figure 8D:
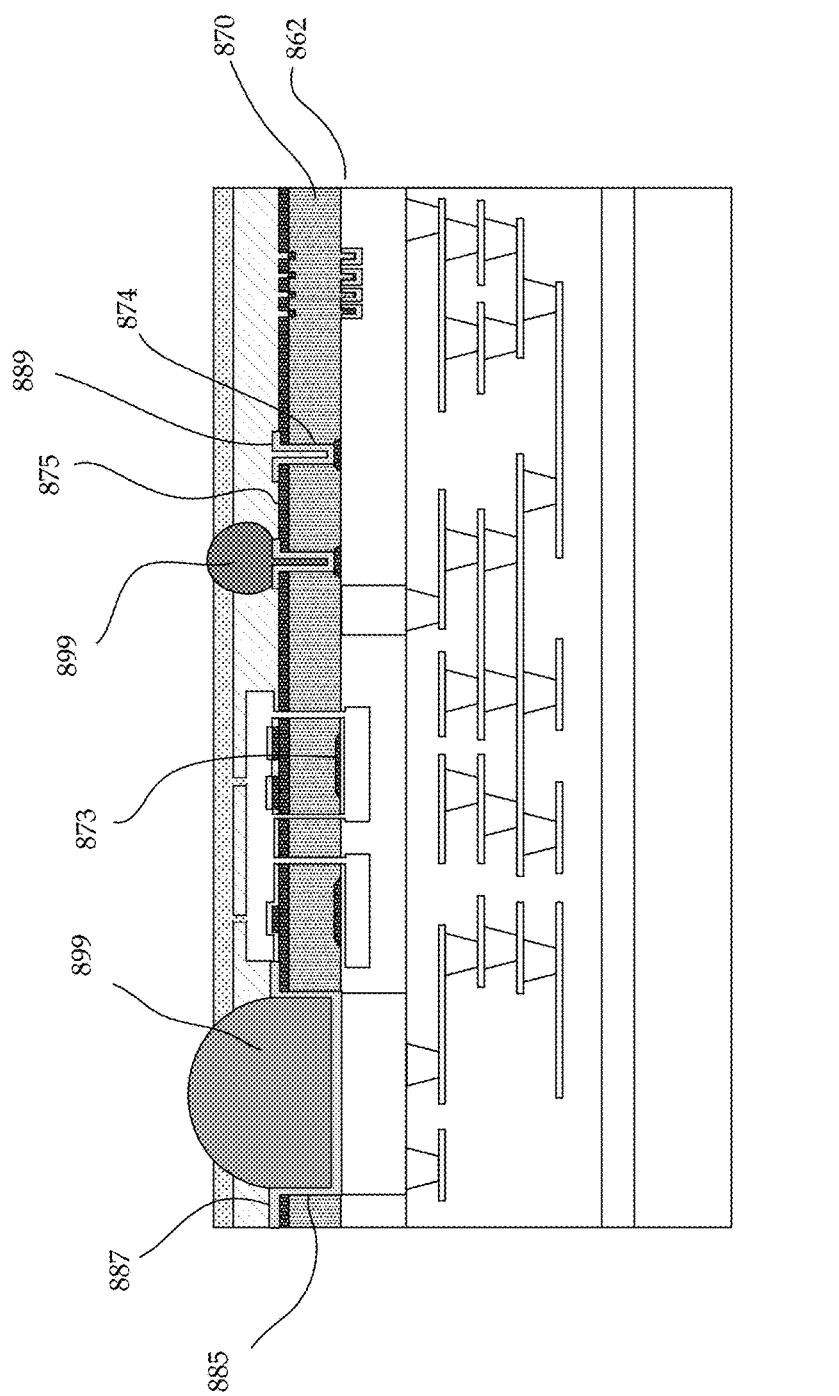

After forming the sacrificial islands, a dielectric layer 862 is deposited over the passivation layer to cover the sacrificial islands, as illustrated in FIG. 8d. For example, the dielectric layer is deposited to sufficiently cover the sacrificial islands. For example, the dielectric layer may be another layer of the passivation layer in the pad level. The dielectric layer may be the same or a different material from the passivation layer. The dielectric layer, for example, may be a silicon oxide layer. Other types of material which is formed using a low temperature process for the dielectric layer may also be useful. A planarization process such as CMP may be performed to provide a substantially planar top surface of the dielectric layer The process continues with forming a MEMS stack of the MEMS device. The MEMS stack includes top and bottom electrodes and an active MEMS layer 870 which are formed over the BEOL region. As shown in FIG. 8d, a bottom electrode 873 of the MEMS device is patterned on the passivation layer, followed by deposition of the active MEMS layer. The active MEMS layer covers the passivation layer and the patterned bottom electrode on the passivation layer. One or more MEMS contact vias 874 may be formed in the active MEMS layer. A MEMS contact via extends from a top surface of the active MEMS layer to expose the patterned bottom electrode. The MEMS contact vias are used to form MEMS contacts in the active MEMS layer which connects the top and bottom electrodes of the MEMS stack.

The top electrode of the MEMS stack is formed on the active MEMS layer. The top electrode may be formed by depositing an electrode layer such as a Mo layer. Other types of conductive material suitable for forming the electrode of a MEMS device may also be useful. The electrode layer is patterned to form the patterned top electrode 875. The top electrode lines the sidewalls and bottom of the MEMS contact vias. A dielectric layer may be deposited over the patterned top electrode. The dielectric layer may be patterned, exposing the MEMS contact vias.

In one embodiment, one or more IC MEMS contact vias are formed through the MEMS stack to expose the IC interconnect pads. As shown in FIG. 8d, a IC MEMS contact via 885 is formed through the MEMS stack. The IC MEMS contact via extends through the MEMS stack to expose the IC interconnect pads. For example, the IC MEMS contact via extends through the entire depth of the active MEMS layer. The IC MEMS contact via may have a vertical sidewall profile. The IC MEMS contact via, for example, may have width of about 50-100 um and a height of about 500 nm to 3 um. Other dimensions and configurations may also be useful. For example, IC MEMS contact via may have a slanted sidewall profile.

A conductive layer is deposited on the wafer, lining the IC MEMS contact vias and the MEMS contact vias. The conductive layer lines the sidewalls and bottom of the IC MEMS contact via and the MEMS contact vias. The conductive layer may have a thickness, for example, of about 0.5 um to 2 um. Other thicknesses may also be useful. The conductive layer may be, for example, Al. Providing other conductive material may also be useful. The conductive layer is patterned to remove a portion of the conductive material on the top surface of the wafer, forming a IC MEMS contact 887 in the IC MEMS contact via and MEMS contacts 889 in the MEMS contact vias. The MEMS contact 889 interconnects the top and bottom electrodes of the MEMS device. As for the IC MEMS contact 887, it contacts the top electrode of the MEMS stack and the IC interconnect pad.

The process continues with forming the MEMS device such as forming release slots in the active MEMS layer for the MEMS cavities release etch process. A release process is then performed to remove the sacrificial material in the sacrificial islands, forming MEMS cavities. For example, lower MEMS cavities are formed in the passivation layer. For example, the lower MEMS cavities are formed below the MEMS stack. Alternatively, the lower MEMS cavity may be released simultaneously with an upper MEMS cavity in a later step. A sacrificial layer or islands which correspond to upper MEMS cavity may be formed on the MEMS stack, followed by an encapsulation over the device. The encapsulation may be a stack of encapsulation layers. For example, a first encapsulation layer is formed over the top electrode and covering the sacrificial islands for the upper MEMS cavity. Openings may be formed in the first encapsulation layer and a release is performed for the upper and lower MEMS cavities depending on process design. A second encapsulation layer may be deposited over the first encapsulation layer. The second encapsulation layer, for example, may be a sealing for the encapsulation. One or more openings may be formed to deposit contact bumps 899, for example, over one or more of the MEMS contacts in the MEMS contact vias and over one or more of the IC MEMS contacts in the IC MEMS contact vias. Other configurations and processes may also be performed to complete the device.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a substrate having first and second surfaces;
   integrated circuit (IC) components disposed on the first surface of the substrate;
   a back-end-of-line (BEOL) dielectric with at least one interlevel dielectric (ILD) level with interconnects and contacts coupled to the IC components disposed on the first surface of the substrate;
   a pad level on an uppermost ILD level, the pad level comprises IC interconnect pads coupled to the IC components via the at least one ILD level;
   a micro electromechanical system (MEMS) stack disposed over the pad level, the MEMS stack includes
      a MEMS region having a MEMS component with MEMS electrodes and MEMS contacts coupled to the MEMS electrodes, and
      an IC region over the IC interconnect pads, the IC region includes IC MEMS contacts configured to be coupled to the IC interconnect pads; and
   a MEMS encapsulation layer disposed over the MEMS stack, including the MEMS and IC regions, the MEMS encapsulation layer comprises a planar top surface, wherein the encapsulation layer comprises MEMS solder bumps in the MEMS region and IC MEMS solder bumps in the IC region.

2. The device of claim 1 comprises a MEMS interposer disposed between the BEOL dielectric and the MEMS stack, wherein the MEMS interposer comprises:
   a dielectric interposer with top and bottom MEMS interposer surfaces; and
   IC interposer contacts which couple the IC MEMS contacts to the IC interconnect pads.

3. The device of claim 2 wherein an IC interposer contact of the IC interposer contacts comprises an array interposer contact having an array of via contacts coupled to an IC interconnect pad of the IC interconnect pads.

4. The device of claim 2 wherein:
   the IC MEMS contacts line IC MEMS contact vias in the MEMS stack, wherein the IC MEMS contact vias extend partially through the MEMS stack;
   the MEMS contacts line MEMS contact vias in the MEMS stack;
   upper portions of the IC interposer contacts extend through a lower portion of the MEMS stack, the IC interposer contacts are coupled to the IC MEMS contacts; and
   wherein the IC MEMS solder bumps fill the IC MEMS contact vias lined with the IC MEMS contacts.

5. The device of claim 2 wherein:
   the IC MEMS contacts line IC MEMS contact vias in the MEMS stack, wherein the MEMS contact vias extend partially through the MEMS stack;
   the MEMS contacts line MEMS contact vias in the MEMS stack;
   tops of IC interposer contacts are coupled to the IC MEMS contacts; and
   wherein the IC MEMS solder bumps fill the IC MEMS contact vias lined with the IC MEMS contacts.

6. The device of claim 2 wherein the IC MEMS contacts, the IC MEMS solder bumps, and the IC interposer contacts comprise solder and form unitary contacts.

7. A device comprising:
   a substrate having first and second surfaces;
   integrated circuit (IC) components disposed on the first surface of the substrate;
   a back-end-of-line (BEOL) dielectric disposed on the first surface of the substrate, the BEOL dielectric covering the IC components, wherein the BEOL dielectric comprises
      a plurality of interlevel dielectric (ILD) levels with contacts and interconnect lines for interconnecting the IC components, and
      a pad level on an uppermost ILD level, the pad level comprises IC interconnect pads; and
   a micro electromechanical system (MEMS) disposed over a top of the BEOL dielectric with the IC interconnect pads, wherein the MEMS comprises
      a MEMS stack, the MEMS stack is disposed directly on the top of the BEOL dielectric, the MEMS stack having a top MEMS surface and a bottom MEMS surface, wherein the MEMS stack includes
         an active MEMS layer having a top active MEMS layer surface and a bottom active MEMS layer surface,
         a patterned top MEMS electrode disposed on the top active MEMS layer surface, and
         a patterned bottom MEMS electrode disposed on the bottom active MEMS layer surface, and
      IC MEMS contacts, wherein the IC MEMS contacts line IC MEMS contact vias which are disposed at least partially through the active MEMS layer, wherein
         the IC MEMS contact vias extend completely through the MEMS stack to expose top surfaces of the interposer contacts, and
         the IC MEMS contacts directly contact the IC interconnect pads.

8. The device of claim 1 wherein:
the IC MEMS contacts line IC MEMS contact vias in the MEMS stack; and
the MEMS contacts line MEMS contact vias in the MEMS stack.

9. The device of claim 8 comprises:
the MEMS solder bumps extending through the encapsulation layer, the MEMS solder bumps are coupled to the MEMS contacts; and
the IC MEMS solder bumps extending through the encapsulation layer, the IC MEMS solder bumps fill the IC MEMS contact vias lined with the IC MEMS contacts.

10. A method of forming a device, comprising:
providing a substrate with first and second surfaces, the substrate is prepared with integrated circuit (IC) components on the first surface of the substrate and a back-end-of-line (BEOL) dielectric formed over the first surface of the substrate with at least one interlevel dielectric (ILD) level with interconnects and contacts coupled to the IC components;
forming a pad level on an uppermost ILD level, the pad level comprises IC interconnect pads coupled to the IC components via the at least one ILD level;
forming a micro electromechanical system (MEMS) stack over the pad level, the MEMS stack includes
a MEMS region having a MEMS component with MEMS electrodes and MEMS contacts coupled to the MEMS electrodes, and
an IC region over the IC interconnect pads, the IC region includes IC MEMS contacts configured to be coupled to the IC interconnect pads;
forming a planar encapsulation layer over the MEMS stack, including the IC and MEMS regions; and
forming MEMS solder bumps and IC solder bumps in the encapsulation layer, wherein the MEMS solder bumps are coupled to the MEMS contacts and the IC solder bumps are coupled to the IC MEMS contacts.

11. The method of claim 10 comprises:
forming a MEMS interposer disposed between the BEOL dielectric and the MEMS stack, wherein the MEMS interposer comprises a dielectric interposer with top and bottom MEMS interposer surfaces; and
forming IC interposer contacts in the MEMS interposer, the IC interposer contacts are coupled the IC interconnect pads.

12. The method of claim 11 wherein forming an IC interposer contact of the IC interposer contacts comprises forming an array interposer contact having an array of via contacts.

13. The method of claim 11 wherein:
the IC MEMS contacts line IC MEMS contact vias in the MEMS stack, wherein the MEMS contact vias extend partially through the MEMS stack;
the MEMS contacts line MEMS contact vias in the MEMS stack;
upper portions of the IC interposer contacts extend through a lower portion of the IC interposer contacts are coupled to the IC MEMS contacts; and MEMS stack, the
wherein the IC solder bumps fill the IC MEMS contact vias lined with the IC MEMS contacts.

14. The method of claim 11 wherein:
the IC MEMS contacts line IC MEMS contact vias in the MEMS stack, wherein the IC MEMS contact vias extend partially through the MEMS stack;
the MEMS contacts line MEMS contact vias in the MEMS stack;
tops of IC interposer contacts are coupled to the IC MEMS contacts; and
wherein the IC solder bumps fill the IC MEMS contact vias lined with the IC MEMS contacts.

15. The method of claim 11 wherein the IC MEMS contacts, the IC solder bumps, and IC interposer contacts comprise solder and form unitary contacts.

16. The method of claim 10 wherein:
the IC MEMS contacts line IC MEMS contact vias in the MEMS stack; and
the MEMS contacts line MEMS contact vias in the MEMS stack.

17. The method of claim 16 wherein:
the MEMS solder bumps extending through the encapsulation layer, the MEMS solder bumps are coupled to the MEMS contacts; and
the IC MEMS solder bumps extending through the encapsulation layer, the IC MEMS solder bumps fill the IC MEMS contact vias lined with the IC MEMS contacts.

18. The method of claim 10 further comprising:
forming a MEMS interposer disposed between the BEOL dielectric and the MEMS stack, wherein the MEMS interposer comprises a dielectric interposer with top and bottom MEMS interposer surfaces; and
forming IC interposer contacts in the MEMS interposer, the IC interposer contacts are coupled the IC interconnect pads.

* * * * *